US008214575B2

(12) United States Patent
Liaw et al.

(10) Patent No.: US 8,214,575 B2
(45) Date of Patent: *Jul. 3, 2012

(54) MEMORY MODULE HAVING SIGNAL LINES CONFIGURED FOR SEQUENTIAL ARRIVAL OF SIGNALS AT SYNCHRONOUS MEMORY DEVICES

(75) Inventors: Haw-Jyh Liaw, Fremont, CA (US); David Nguyen, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/975,313

(22) Filed: Dec. 21, 2010

(65) Prior Publication Data

US 2011/0090727 A1   Apr. 21, 2011

Related U.S. Application Data

(63) Continuation of application No. 12/426,083, filed on Apr. 17, 2009, now Pat. No. 7,870,322, which is a continuation of application No. 11/459,858, filed on Jul. 25, 2006, now Pat. No. 7,523,244, which is a continuation of application No. 09/839,768, filed on Apr. 19, 2001, now Pat. No. 7,085,872, which is a continuation of application No. 09/507,303, filed on Feb. 18, 2000, now Pat. No. 6,266,730, which is a continuation of application No. 08/938,084, filed on Sep. 26, 1997, now Pat. No. 6,067,594.

(51) Int. Cl.
*G06F 13/42* (2006.01)
(52) U.S. Cl. ...................................................... 710/305
(58) Field of Classification Search ............... 365/52; 713/503; 361/777–778; 174/261–262; 710/305
See application file for complete search history.

(56) References Cited

U.S. PATENT DOCUMENTS 3,359,510 A   12/1967   Geiszler .......................... 333/1.1
3,651,432 A   3/1972   Henschen et al. ................ 333/33

(Continued)

FOREIGN PATENT DOCUMENTS

EP   0015583 A1   9/1980

(Continued)

OTHER PUBLICATIONS

Extended European Search Report and Written Opinion, dated Feb. 29, 2008 (from related case EP 1 884 953 A2).

(Continued)

*Primary Examiner* — Paul Myers
(74) *Attorney, Agent, or Firm* — Morgan, Lewis & Bockius LLP

(57) ABSTRACT

A memory module includes a first signal line to carry a first signal. The first signal line has (i) a first line segment disposed along a length of the memory module and coupled to a termination, and (ii) a second line segment disposed along a width of the memory module and coupled to an edge finger. The first line segment and the second line segment are coupled together at a turn. A first synchronous memory device and a second synchronous memory device are coupled to the first line segment. The first signal arrives at the first synchronous memory device and the second synchronous memory device in a sequential manner. The memory module includes a clock line routed alongside the first signal line. A clock signal arrives at the first synchronous memory device and the second synchronous memory device in sequence alongside the first signal traversing along the first signal line.

25 Claims, 21 Drawing Sheets

U.S. PATENT DOCUMENTS

| | | | | |
|---|---|---|---|---|
| 3,659,205 A | 4/1972 | Cooke et al. | 455/198.1 |
| 3,718,936 A | 2/1973 | Rice, Jr. | 347/148 |
| 3,820,081 A | 6/1974 | Donahue | 711/151 |
| 3,868,162 A | 2/1975 | Ammon | 439/75 |
| 3,880,493 A | 4/1975 | Lockhart, Jr. | 439/525 |
| 4,005,372 A | 1/1977 | Ho et al. | 330/287 |
| 4,007,452 A | 2/1977 | Hoff | 365/63 |
| 4,096,571 A | 6/1978 | Vander May | 364/200 |
| 4,266,282 A | 5/1981 | Henle et al. | 365/52 |
| 4,310,809 A | 1/1982 | Buck et al. | 331/117 D |
| 4,439,813 A | 3/1984 | Dougherty et al. | 361/321.3 |
| 4,473,755 A | 9/1984 | Imai et al. | 307/10.1 |
| 4,567,545 A | 1/1986 | Mettler, Jr. | 361/764 |
| 4,627,050 A | 12/1986 | Johnson et al. | 370/363 |
| 4,656,605 A | 4/1987 | Clayton | 365/52 |
| 4,781,624 A | 11/1988 | Shepherd | 439/620 |
| 4,788,766 A | 12/1988 | Burger et al. | 29/830 |
| 4,798,918 A | 1/1989 | Kabadi et al. | 174/36 |
| 4,818,956 A | 4/1989 | Stajcer | 331/96 |
| 4,879,631 A | 11/1989 | Johnson et al. | 361/684 |
| 4,943,984 A | 7/1990 | Pechanek et al. | 375/358 |
| 5,018,000 A | 5/1991 | Yamada et al. | 257/532 |
| 5,038,317 A | 8/1991 | Callan et al. | 364/900 |
| 5,097,489 A | 3/1992 | Tucci | 375/120 |
| 5,101,322 A | 3/1992 | Ghaem et al. | 361/715 |
| 5,103,247 A | 4/1992 | Sugano et al. | 361/785 |
| 5,117,389 A | 5/1992 | Yiu | 365/104 |
| 5,164,916 A | 11/1992 | Wu et al. | 365/52 |
| 5,189,638 A | 2/1993 | Kimura | 365/52 |
| 5,257,950 A | 11/1993 | Lenker et al. | 439/620 |
| 5,259,768 A | 11/1993 | Brunker et al. | 439/60 |
| 5,266,912 A | 11/1993 | Kledzik | 333/247 |
| 5,270,964 A | 12/1993 | Bechtolsheim et al. | 365/52 |
| 5,307,309 A | 4/1994 | Protigal et al. | 365/63 |
| 5,329,174 A | 7/1994 | Chaing | 327/313 |
| 5,329,484 A | 7/1994 | Tsuiki | 365/45 |
| 5,334,962 A | 8/1994 | Higgins et al. | 333/247 |
| 5,357,621 A | 10/1994 | Cox | 711/172 |
| 5,363,071 A | 11/1994 | Schwent et al. | 333/111 |
| 5,379,438 A | 1/1995 | Bell et al. | 712/16 |
| 5,383,148 A | 1/1995 | Testa et al. | 365/52 |
| 5,384,558 A | 1/1995 | Maruhashi | 333/33 |
| 5,426,405 A | 6/1995 | Miller et al. | 333/247 |
| 5,432,823 A | 7/1995 | Gasbarro et al. | 375/107 |
| 5,432,916 A | 7/1995 | Hahn et al. | 710/302 |
| 5,448,699 A | 9/1995 | Goss et al. | 395/275 |
| 5,461,352 A | 10/1995 | Noguchi et al. | 333/204 |
| 5,465,229 A | 11/1995 | Bechtolsheim et al. | 365/52 |
| 5,502,621 A | 3/1996 | Schumacher et al. | 361/760 |
| 5,513,135 A | 4/1996 | Dell et al. | 365/52 |
| 5,530,623 A | 6/1996 | Sanwo et al. | 361/788 |
| 5,532,954 A | 7/1996 | Bechtolsheim et al. | 365/52 |
| 5,550,875 A | 8/1996 | Bennett | 375/356 |
| 5,562,530 A | 10/1996 | Runnels | 451/36 |
| 5,577,236 A | 11/1996 | Johnson et al. | 395/551 |
| 5,578,940 A | 11/1996 | Dillon et al. | 326/30 |
| 5,579,352 A | 11/1996 | Llewellyn | 375/376 |
| 5,586,270 A | 12/1996 | Rotier et al. | 395/282 |
| 5,598,035 A | 1/1997 | Rusu et al. | 257/723 |
| 5,604,454 A | 2/1997 | Maguire et al. | 327/112 |
| 5,612,657 A | 3/1997 | Kledzik et al. | 333/247 |
| 5,615,358 A | 3/1997 | Vogley | 395/556 |
| 5,635,767 A | 6/1997 | Wenzel et al. | 257/777 |
| 5,652,530 A | 7/1997 | Ashuri | 326/93 |
| 5,663,661 A | 9/1997 | Dillon et al. | 326/30 |
| 5,674,077 A | 10/1997 | Flaig et al. | 439/63 |
| 5,708,297 A | 1/1998 | Clayton | 257/723 |
| 5,734,208 A | 3/1998 | Jones | 307/149 |
| 5,764,489 A | 6/1998 | Leigh et al. | 361/777 |
| 5,771,158 A | 6/1998 | Yamagishi et al. | 361/777 |
| 5,778,419 A | 7/1998 | Hansen et al. | 711/112 |
| 5,928,343 A | 7/1999 | Farmwald et al. | 710/104 |
| 5,929,729 A | 7/1999 | Swarup | 333/246 |
| 5,943,573 A | 8/1999 | Wen | 438/275 |
| 5,982,018 A | 11/1999 | Wark et al. | 257/532 |
| 5,987,576 A | 11/1999 | Johnson et al. | 711/167 |
| 6,034,878 A | 3/2000 | Osaka et al. | 365/52 |
| 6,065,092 A | 5/2000 | Roy | 711/5 |
| 6,067,594 A | 5/2000 | Perino et al. | 710/301 |
| 6,115,318 A | 9/2000 | Keeth | 365/233.13 |
| 6,131,149 A | 10/2000 | Lu et al. | 711/167 |
| 6,185,644 B1 | 2/2001 | Farmwald et al. | 710/301 |
| 6,266,730 B1 | 7/2001 | Perino et al. | 710/126 |
| 6,292,877 B1 | 9/2001 | Ryan | 711/169 |
| 6,292,903 B1 | 9/2001 | Coteus et al. | 713/401 |
| 6,330,164 B1 | 12/2001 | Khandros et al. | 361/760 |
| 6,392,897 B1 | 5/2002 | Nakase et al. | 361/785 |
| 6,513,081 B2 | 1/2003 | Farmwald et al. | 710/107 |
| 6,553,472 B2 | 4/2003 | Yang et al. | 711/167 |
| 6,611,905 B1 | 8/2003 | Grundon et al. | 711/167 |
| 6,804,764 B2 | 10/2004 | LaBerge et al. | 711/170 |
| 6,807,614 B2 | 10/2004 | Chung | 711/168 |
| 6,853,557 B1 | 2/2005 | Haba et al. | 361/760 |
| 6,928,571 B1 | 8/2005 | Bonella et al. | 713/401 |
| 6,970,988 B1 | 11/2005 | Chung | 711/168 |
| 7,076,745 B2 | 7/2006 | Togo | 716/1 |
| 7,100,066 B2 | 8/2006 | Jeong | 713/500 |
| 7,224,595 B2 | 5/2007 | Dreps et al. | 365/63 |
| 7,523,244 B2 | 4/2009 | Liaw et al. | 710/305 |
| 2001/0009276 A1 | 7/2001 | Farmwald et al. | 257/1 |
| 2006/0277345 A1 | 12/2006 | Liaw et al. | 710/305 |
| 2007/0150635 A1 | 6/2007 | Liaw et al. | 710/305 |
| 2007/0150636 A1 | 6/2007 | Liaw et al. | 710/305 |
| 2007/0156943 A1 | 7/2007 | Liaw et al. | 710/305 |
| 2007/0216800 A1 | 9/2007 | Liaw et al. | 348/443 |

FOREIGN PATENT DOCUMENTS

| | | |
|---|---|---|
| EP | 410769 A1 | 1/1991 |
| EP | 0657797 | 6/1995 |
| EP | 0855653 | 7/1998 |
| GB | 2170047 A | 7/1986 |
| GB | 2237691 | 5/1991 |
| JP | 59004204 A | 1/1984 |
| JP | 04068561 A | 3/1992 |
| JP | 08221980 A | 8/1996 |

OTHER PUBLICATIONS

Extended European Search Report and Written Opinion, dated Feb. 29, 2008 (from related case EP 1 863 130 A2).

Extended European Search Report and Written Opinion, dated Feb. 29, 2008 (from related case EP 1 863 131 A2).

Dillon, J et al., "Rambus Channel Design Guide," Rambus Inc., 1994, 82 pages.

Dillon, J. et al., "Rambus System Design Guide," Rambus Inc., 1994, 72 pages.

Dillon, J., et al., "Rambus System Design Guide," 1992, pp. 1-48.

Gillingham, Peter, "SLDRAM Architectural and Functional Overview," 1997 SLDRAM Consortium, Aug. 29, 1997, 14 pages.

Horowitz, "The Art of Electronics," Other Passive Components, 1.32 Electromechanical Devices, 1989, 2 pgs.

Rambus Inc., "⅝-Mbit (1M x ⅝) and ¹⁶⁄₁₈-Mbit (2M x ⅝) RDRAM," Preliminary Information, Data Sheet, Mar. 1996, 30 pages.

Rambus Inc., "64-Megabit Rambus DRAM Technology Directions," Rambus Inc., 24 pages, 1995.

Rambus Inc., "Architectural Overview," Rambus, Inc., 1992, 20 pages.

Rambus Inc., "RDRAM Reference Manual," Rambus Inc., 1993, 255 pages.

Rambus Inc., "RModule," Product Summary, pp. 47-65, 1993.

Rambus Inc., "RTransceiver," Datasheet, Rev. 0.3, 10 pages, 1993.

Microprocessor and Microcomputer Standards Subcommittee of the IEEE Computer Society, "Draft Standard for a High-Speed Memory Interface (SyncLink)," 1996, 66 pages.

Dictionary of Computers Information Processing & Telecommunications, 2d Ed., 1990, definition of "module."

Websters II New Riverside University Dictionary, 1988, definition of "alongside."

European Office Action for re EP Application No. 07114348.1-2210 dated Mar. 15, 2010, 4 pgs.

European Office Action for re EP Divisional Application No. 07114628.6 dated Mar. 15, 2010, 5 pgs.

European Office Action for re EP Application No. 07114627.8-2210 dated Mar. 15, 2010, 5 pgs.

European Response dated Jun. 23, 2010 re European Application No. 07114348.1, 19 pgs.
European Response dated Jun. 23, 2010 re European Application No. 07114627.8, 16 pgs.
European Response dated Jun. 23, 2010 re European Application No. 07114628.6, 21 pgs.
Office Action with mail date of May 19, 2010 re U.S. Appl. No. 12/426,083 includes Notice of References Cited and Information Disclosure Statement, 12 pgs.
Response dated Jun. 22, 2010 to the Office Action dated May 19, 2010 re U.S. Appl. No. 12/426,083, includes Terminal Disclaimer, 10 pgs.
Notice of Allowance and Fee(s) Due with mail date of Jul. 27, 2010 for U.S. Appl. No. 12/426,083, 4 pgs.
Minutes of the Oral Proceedings before the Examining Division with mail date of Aug. 24, 2010 re EP Patent Application No. 98948454.8-2214, application to become abandoned, 29 pgs.
Information Disclosure Statement dated Aug. 25, 2010, in U.S. Appl. No. 12/426,083, 5 pgs.
Notice of Allowance and Fee(s) Due, dated Sep. 3, 2010, in re U.S. Appl. No. 12/426,083, includes Supplemental NOA and Information Disclosure Citation, 5 pgs.
EP Summons dated Jul. 19, 2011 to Attend Oral Proceedings re EP Application No. 07114348.1, 3 pgs.
EP Summons dated Jul. 19, 2011 to Attend Oral Proceedings re EP Application No. 07114627.8, 4 pgs.
EP Summons dated Jul. 19, 2011 to Attend Oral Proceedings re EP Application No. 07114628.6, 4 pgs.
Rambus, EP Response dated Mar. 28, 2012 re EP Application No. 07114348.1, includes New claims (highlighted and clear copy) and new description pages, 17 pages.
Rambus, EP Response dated Mar. 28, 2012 re EP Application No. 07114627.8, includes New claims (highlighted and clear copy) and new description page, 12 pages.
Rambus, EP Response dated May 4, 2012 re EP Application No. 07114348.1, includes New claims (highlighted and clear copy), 8 pages.
Rambus, EP Submission dated May 9, 2012 re EP Application No. 07114348.1, includes main request (highlighted amendments and clear copy), auxiliary request I (highlighted amendments and clear copy), and auxiliary request II (highlighted amendments and clear copy), 14 pages.
Rambus, EP Submission dated May 9, 2012 re EP Application No. 07114627.8, includes main request (highlighted amendments and clear copy), auxiliary request I (highlighted amendments and clear copy), and auxiliary request II (highlighted amendments and clear copy), 18 pages.
Rambus, EP Response dated May 8, 2012 re EP Application No. 07114627.8, includes annotated version of figures, 9 pages.
Rambus, EP Minutes dated May 4, 2012 interview with the primary examiner in EP Application No. 07114348.1, 25 Pages.
Rambus, EP Minutes dated May 2, 2012 interview with the primary examiner in EP Application No. 07114348.1, 3 Pages.
Rambus, EP Minutes dated May 2, 2012 interview with the primary examiner in EP Application No. 07114627.8, 1 Pages.

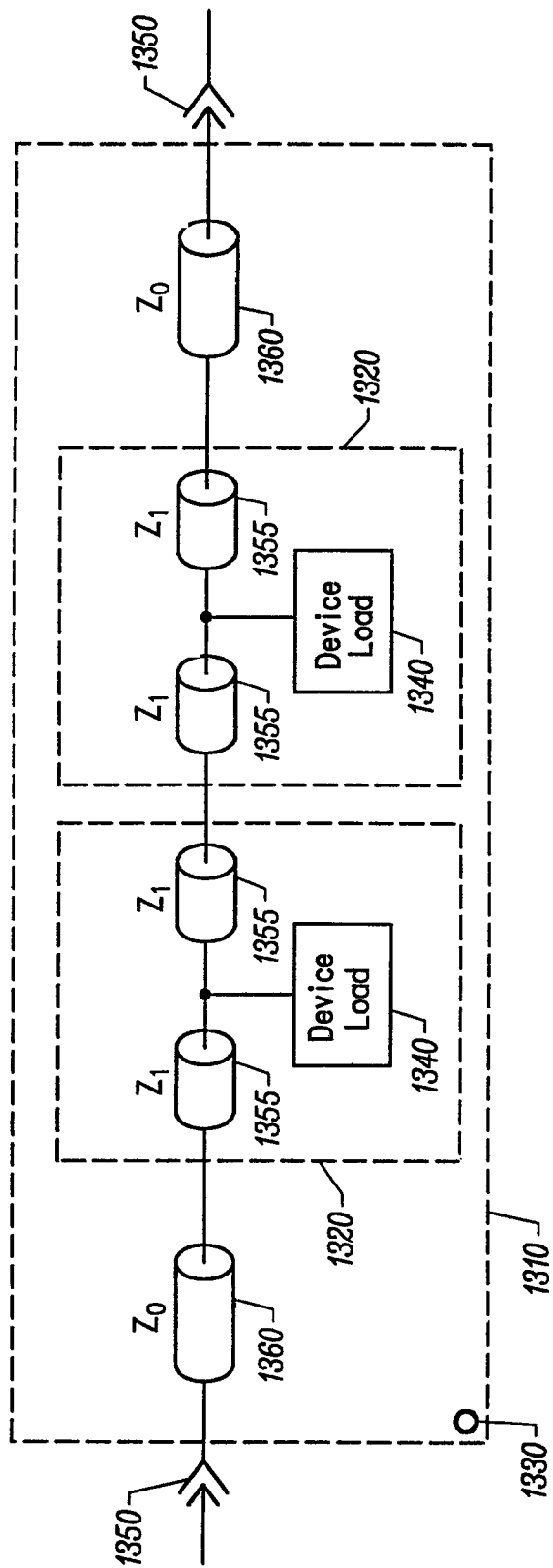
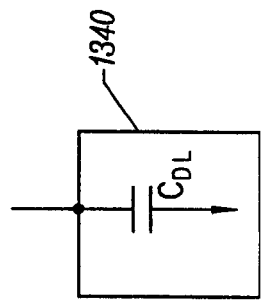
FIG. 13A
FIG. 13B

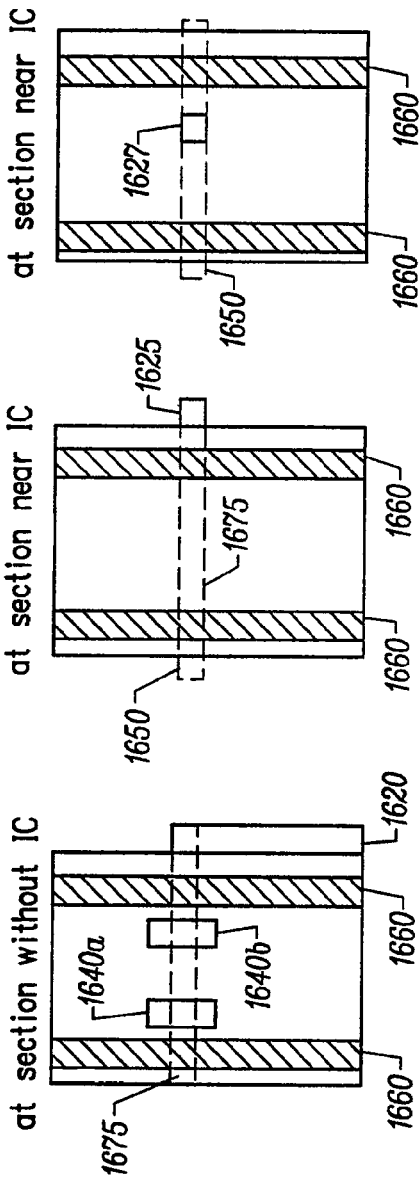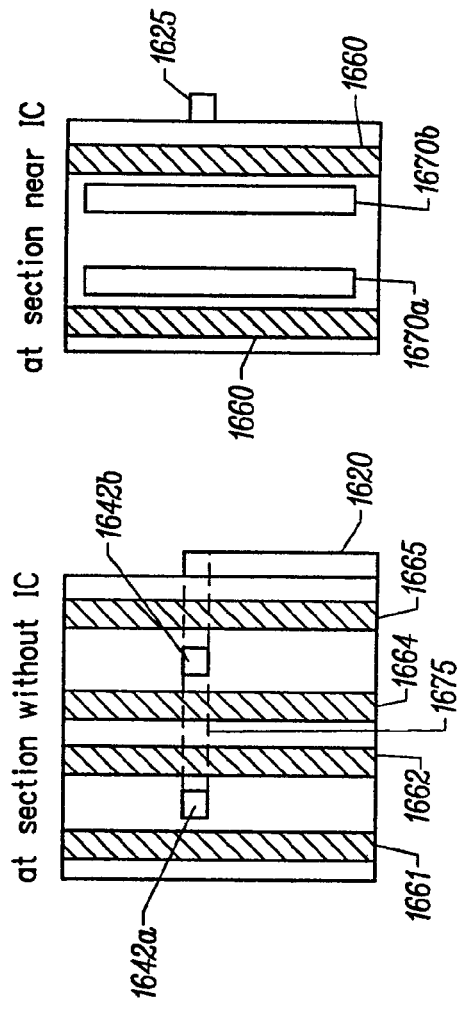
FIG. 16A  FIG. 16B  FIG. 16C  FIG. 16D  FIG. 16E

MEMORY MODULE HAVING SIGNAL LINES CONFIGURED FOR SEQUENTIAL ARRIVAL OF SIGNALS AT SYNCHRONOUS MEMORY DEVICES

RELATED APPLICATIONS

This application is a continuation of U.S. application Ser. No. 12/426,083, filed Apr. 17, 2009, now U.S. Pat. No. 7,870,322 which is a continuation of U.S. patent application Ser. No. 11/459,858, filed Jul. 25, 2006, now U.S. Pat. No. 7,523,244, which is a continuation of U.S. patent application Ser. No. 09/839,768, filed Apr. 19, 2001, now U.S. Pat. No. 7,085,872, which is a continuation of U.S. patent application Ser. No. 09/507,303, filed Feb. 18, 2000, now U.S. Pat. No. 6,266,730, which is a continuation of U.S. patent application Ser. No. 08/938,084, filed Sep. 26, 1997, which is now U.S. Pat. No. 6,067,594, which applications are incorporated by reference herein in their entirety.

BACKGROUND

As computer processors increase in speed they require increased information bandwidth from other subsystems supporting the processor. An example is the large amount of bandwidth needed by video and 3D image processing from a computer memory subsystem. Another example is a main memory subsystem. One or more high frequency buses are typically employed to provide the bandwidth required. The higher the frequency of operation of the bus, the greater the requirement that the signals on the bus have high-fidelity and equal propagation times to the devices making up the subsystem. High-fidelity signals are signals having little or no ringing and controlled and steady rising and falling edge rates. Many obstacles are encountered in assuring the uniform arrival times of high-fidelity signals to devices on the bus. One such obstacle is a requirement that a subsystem be modular, meaning that portions of a subsystem may be added and possibly removed. The modularity requirement implies that devices that are part of the modular subsystem be mounted on a separate substrate or module which couples to another board, the motherboard. It also implies the use of connectors if both addition and removal is required. Other obstacles are the number of layers of the motherboard on which routing of the bus is allowed and whether the bus is routed in a straight line or routed with turns. Too few layers on a motherboard, or a module, and turns of the lines may not permit the construction of the bus lines in a way necessary to achieve uniform arrival times of high-fidelity signals to devices on the bus.

Modular subsystems in computers have numerous advantages, some of which are field upgradeability, replacement of a failing device, flexibility of initial configuration, and increased device density. Currently, so called SIMMs (single in-line memory module) and DIMMs (dual in-line memory modules) are examples of computer memory systems employing such modules. Because of these advantages and the desirability of having high performance modular memory subsystems, it is especially important to have buses with uniform arrival times to devices in applications where modules are employed.

One form of module technology, using buses, is oriented to a grid topology having three groups of lines as shown in FIG. 1. In the first group 120, all of the lines connect to all devices on all modules 140a-c. In the second group 110, the group is partitioned into a number of subgroups, 112, 114, 116, and 118, which connect to a corresponding device in each module. For example, in FIG. 1, a portion, say 1, 4, or 8 lines are routed to a similarly situated device in each module. In the third group 130, the lines are typically radially connected to the modules and all devices in a particular module connect to the dedicated radial line or lines. For a memory module, the first group 120 is representative of address bus and clock lines, the second group 110 of the data bus or buses and the third group 130 of the control lines, such as RAS and CAS. Corresponding to each group is a representative transmission line having a certain set of characteristics, such as propagation delay and loaded or unloaded characteristic impedance, which are different for each group. This leads to difficulty in matching the arrival of signals of each group at the devices on the modules and limits the performance that can be obtained from such a topology due to waiting on the delays of the slowest group of lines, which waiting also includes the settling of the lines when not properly terminated.

A circuit model of a tapped line, typical of the second group of lines, is shown in FIG. 3. As shown, in this topology, each line in a group is typically connected to a module by means of a stub 360 which acts as tap off of the line as shown in FIG. 2 and FIG. 3. A stub is defined as a length of line tapped from a transmission line and having a round trip delay which is greater than the rise time (or fall time) of the signal. Since the stub 360 (160 in FIG. 2) typically has a different impedance than the line being tapped, it is often necessary to insert a resistor 320, as shown in FIG. 3, in series with the stub to mitigate the effect of reflections at the connection point of the stub to the line. If the line impedance is about 50 ohms and the impedance of the stub is about 75 ohms, a resistor of approximately 20-25 ohms is typically chosen usually by trial and error for the best results under certain conditions. This resistor has the possibly undesirable effect of attenuating the voltage swing of the signal as the signal passes through the resistor, requiring a driver on the stub to have a proportionately larger voltage swing. Another undesirable effect is the RC delay due to the added series resistor and the device capacitance. The resistors and stubs also lead to low-fidelity signals at the devices. Also, as shown in FIG. 3, the line is terminated by resistors 350 at both ends to minimize reflections from the ends of the line. This requires that the drivers on the line supply twice as much steady state current as compared to a line terminated at only one end.

As mentioned above, the need to incorporate memory modules into the design of the modular system may also imply the use of connectors. In general, connectors have undesirable characteristics for operating at high frequency, such as inductance, capacitance, or crosstalk which introduces noise from one line into another line. Failure to take the connector characteristics into account leads to non-uniform arrival characteristics and low-fidelity signals when crossing a connector boundary resulting in lower performance (due to longer settling times, reduced noise margin or different signal propagation speed) from the modular system using the lines.

The physical shape, size and construction of the memory module is important to consider as well. The physical nature of the memory module may force the IC devices mounted on the module to be arranged in a less-than-optimal topology for the high frequency transmission line layout. High frequency signaling typically requires that electrical paths be controlled; signal delays need to be minimized or matched and impedance needs to be tightly controlled for high frequency operation, where high frequency means frequencies in the range of 200 megahertz to at least 1,000 megaHertz.

For the foregoing reasons, there is a need for a bus connecting to a plurality of devices which has uniform arrival times of high-fidelity signals to the devices on the bus, even when modules and connectors are employed to build a computer subsystem in which the bus is used and despite the physical size, shape and construction of the module and the number of devices mounted on it.

SUMMARY OF THE INVENTION

The present invention is directed to a high frequency bus system which insures uniform arrival times of high-fidelity signals to the devices on the high frequency bus, despite the use of the bus on modules and connectors. A high frequency bus system includes a first bus segment having one or more devices connected between a first and a second end. The first bus segment has at least a pair of transmission lines for propagating high frequency signals and the devices are coupled to the pair of transmission lines. The high frequency bus system also includes a second bus segment which has no devices connected to it. The second bus segment also has at least a pair of transmission lines for propagating high frequency signals. The first end of the first segment and second end of the second segment are coupled in series to form a chain of segments and when two signals are introduced to the first end of the second bus segment at the substantially the same time, they arrive at each device connected to the first bus segment at substantially the same time. Also, when two signals originate at a device connected to the first bus segment at substantially the same time, they arrive at the first end of the second bus segment at substantially the same time. Uniform arrival times hold despite the use of connectors to couple the segments together, despite the segments being located on modules, without the need for stubs, despite the presence of routing turns in the segments and despite the type of information, such as address, data or control, carried by the signals.

In a preferred embodiment, the bus runs along a motherboard (second segment), onto one end of a memory module, then along the memory module (first segment), and exits the other end of the memory module along another motherboard segment to a next memory module. By running the bus through the module, stubs between a motherboard bus and each device are avoided, eliminating the need for resistors to compensate for reflections caused by the stubs. Preferably, each bus goes to all devices, using a control packet to select particular devices as needed.

In a preferred embodiment, the uniform arrival time is also insured by a number of routing and impedance modifying techniques. In particular, the total length traveled by different busses is equalized by having shorter horizontal length bus lines connected with corresponding longer vertical lengths joined by a right angle. In another aspect, parallel bus lines are used to equalize impedance for internally routed lines, since they have dielectric material on both sides, compared to a surface line with dielectric on only one side.

BRIEF DESCRIPTION OF THE DRAWINGS

FIG. 13A depicts a circuit model of a data transmission line on the module for an embodiment of the present invention.

FIG. 13B depicts a circuit model of a device load on the module for an embodiment of the present invention.

FIGS. 16A-16E show cross-section views of a module in various embodiments of the present invention.

DETAILED DESCRIPTION OF THE INVENTION

Figure 1:
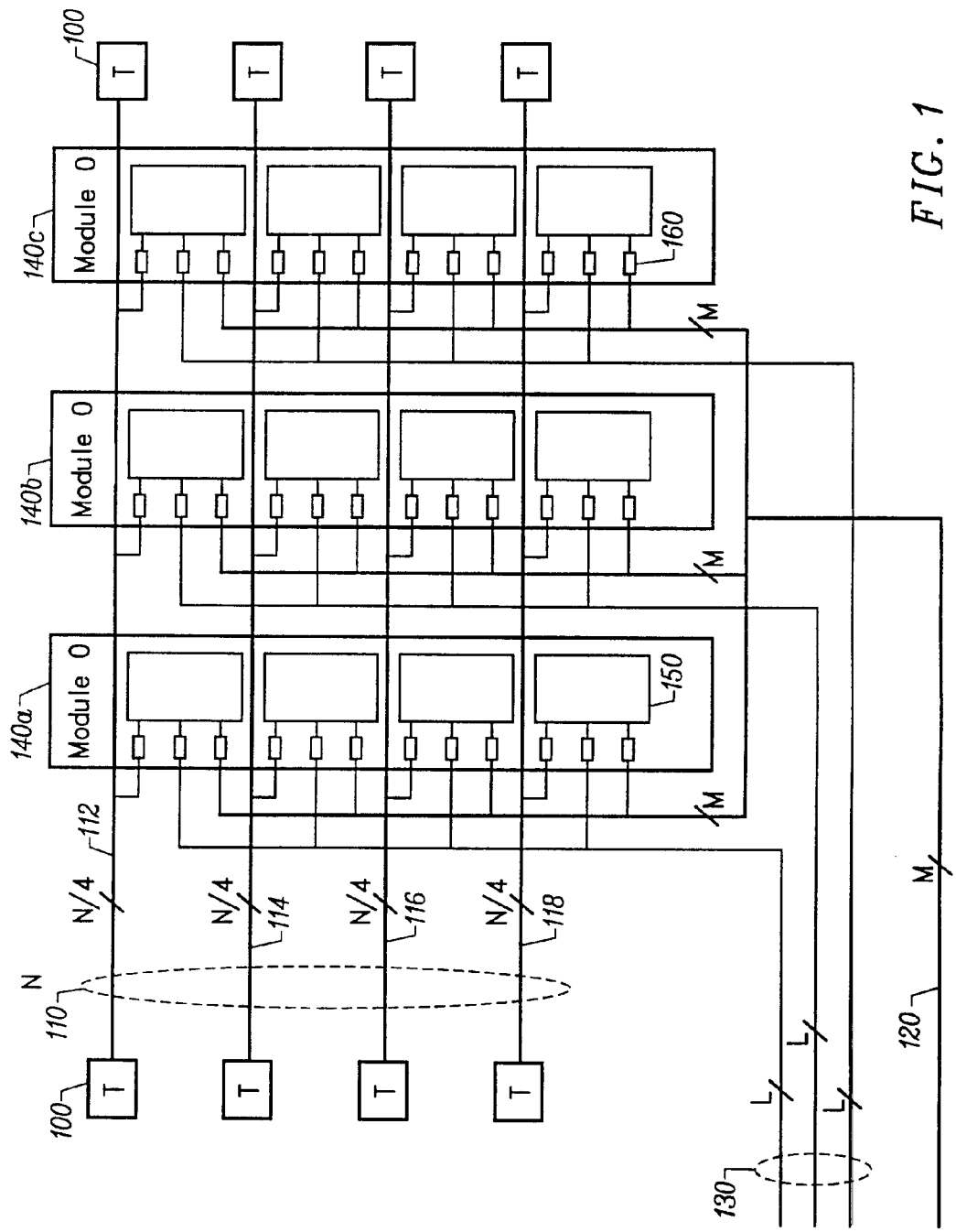
FIG. 1 shows the routing topology for a prior art modular memory system.
Figure 2:
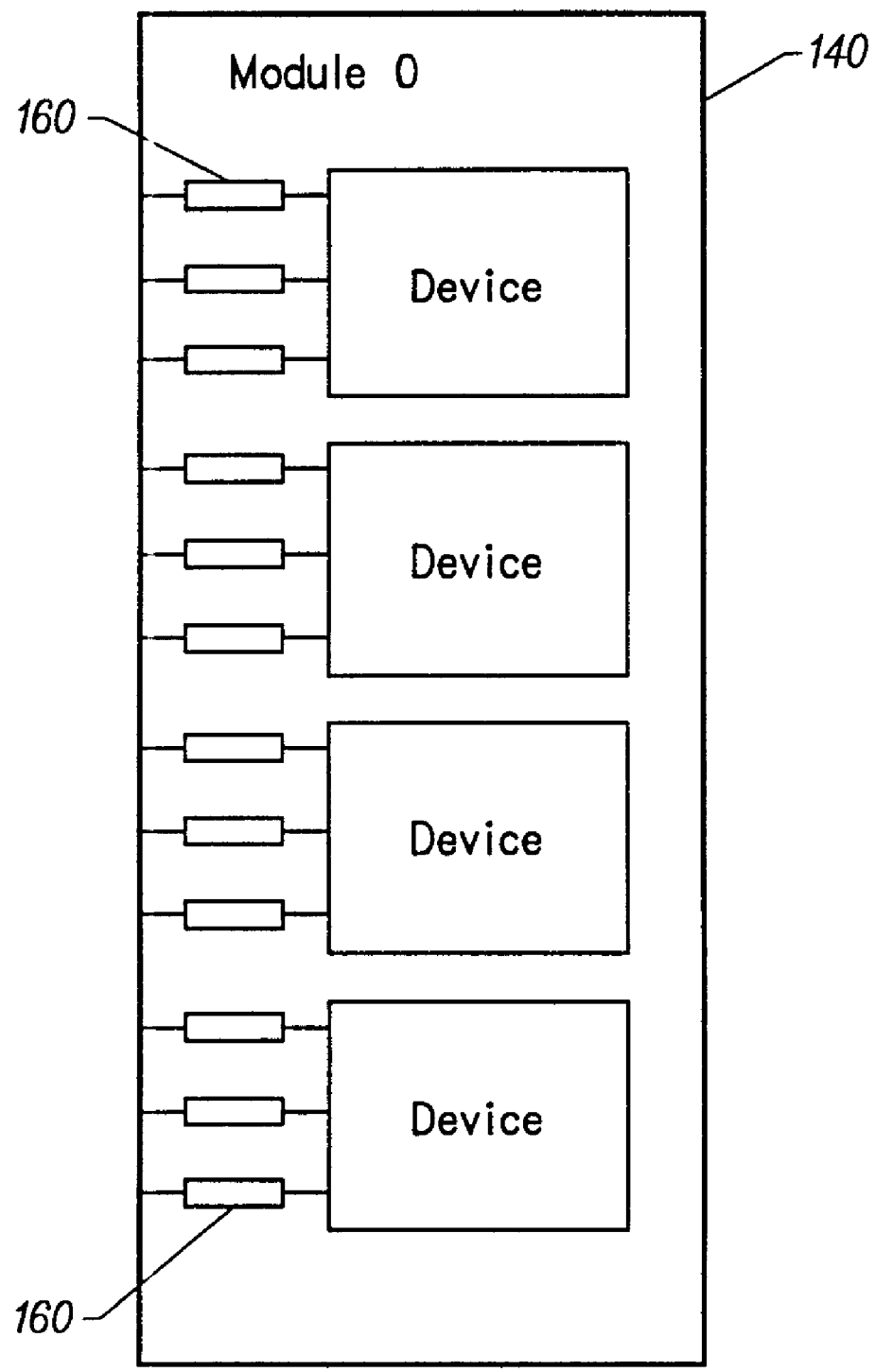
FIG. 2 shows a prior art memory module of the type employed in FIG. 1.
Figure 3:
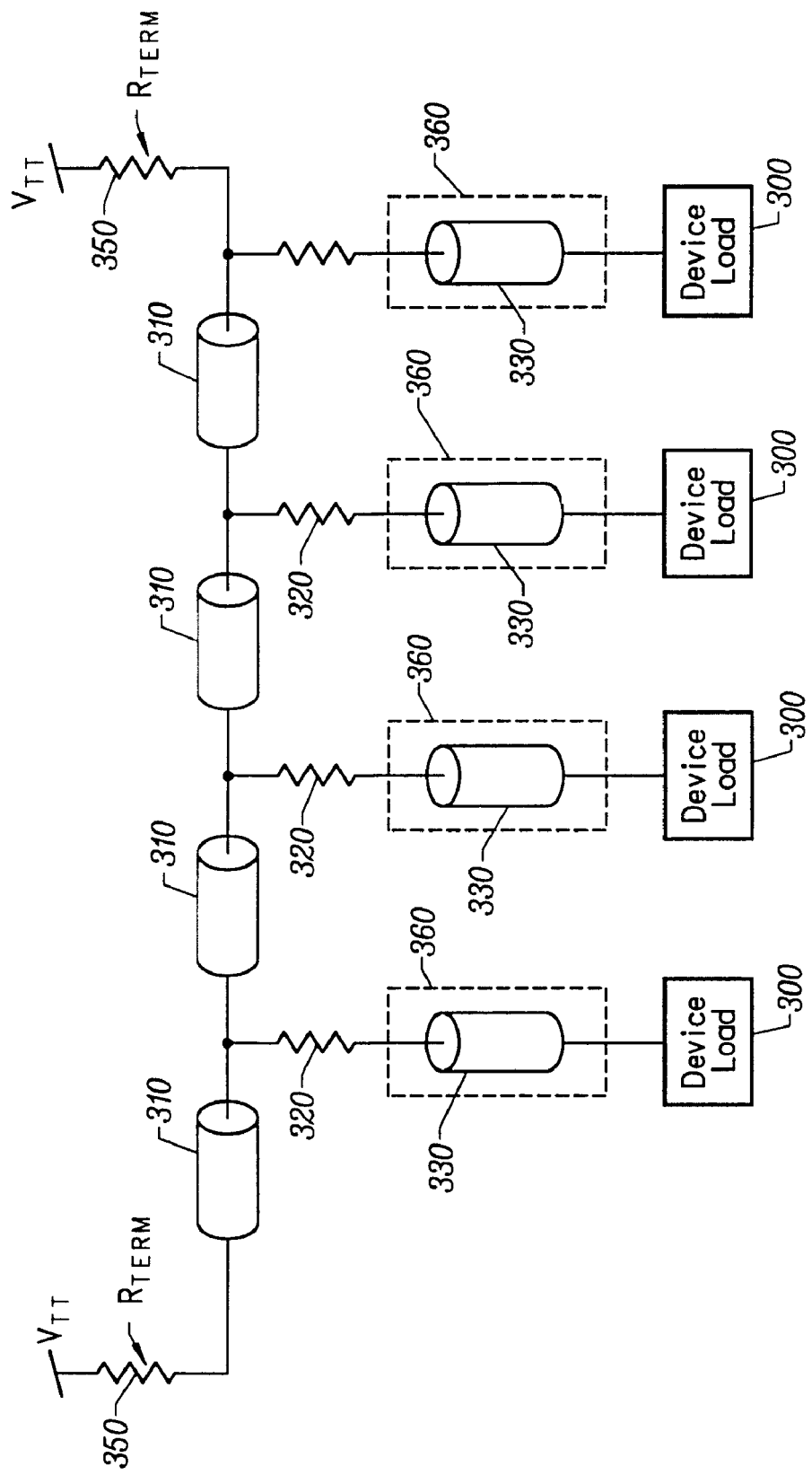
FIG. 3 shows a circuit model of a transmission line of a prior art module used in FIG. 1, including the terminators and the stubs.
Figure 4:
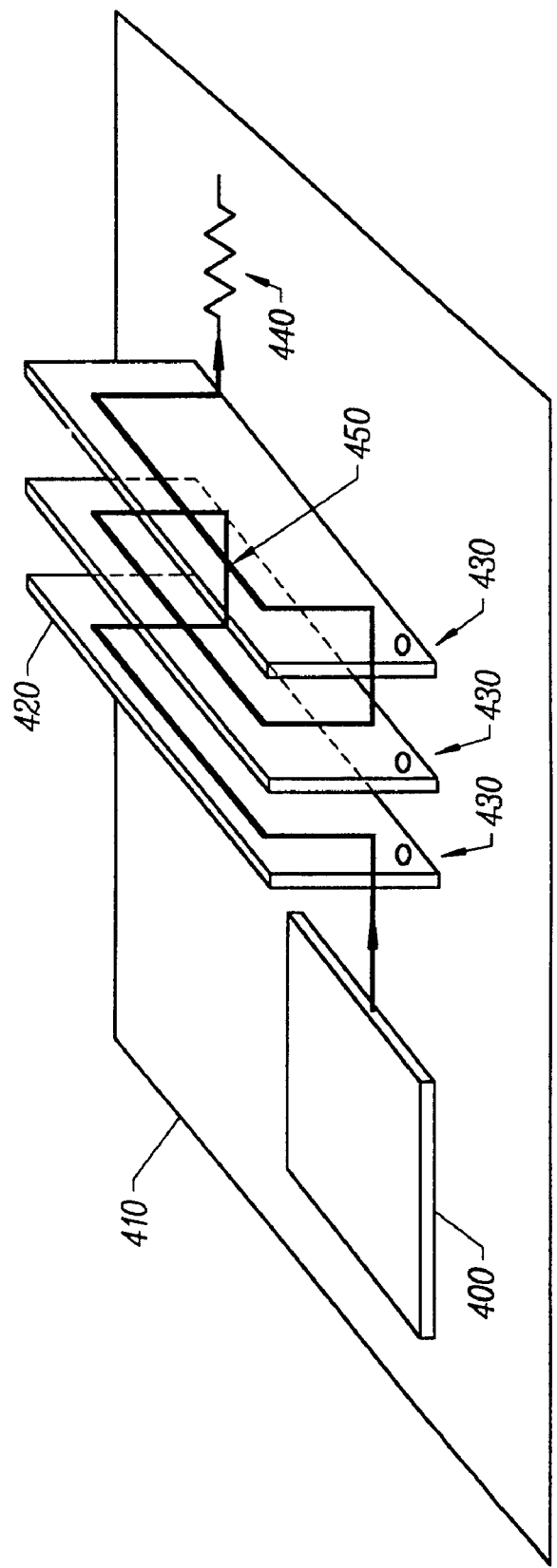
FIG. 4 gives a perspective view of an embodiment of the present invention.

FIG. 4 shows a perspective view of an embodiment of the present invention. Motherboard 410 acts as the substrate to which device modules 420 are coupled. A device 400 on the motherboard acts as a master which controls the devices on the modules. A high frequency bus 450 is routed from master 400 on the motherboard, through each module and finally to a terminator 440 on the motherboard. Each module 420 has a marking or key 430 to assure that each module is coupled with the same orientation to the motherboard. A device module 420 may or may not have devices mounted on it. A module with no devices still has the bus routed through it and is termed a continuity module. Continuity modules are used to preserve the continuity of the bus when modules must be removed.

Figure 5:
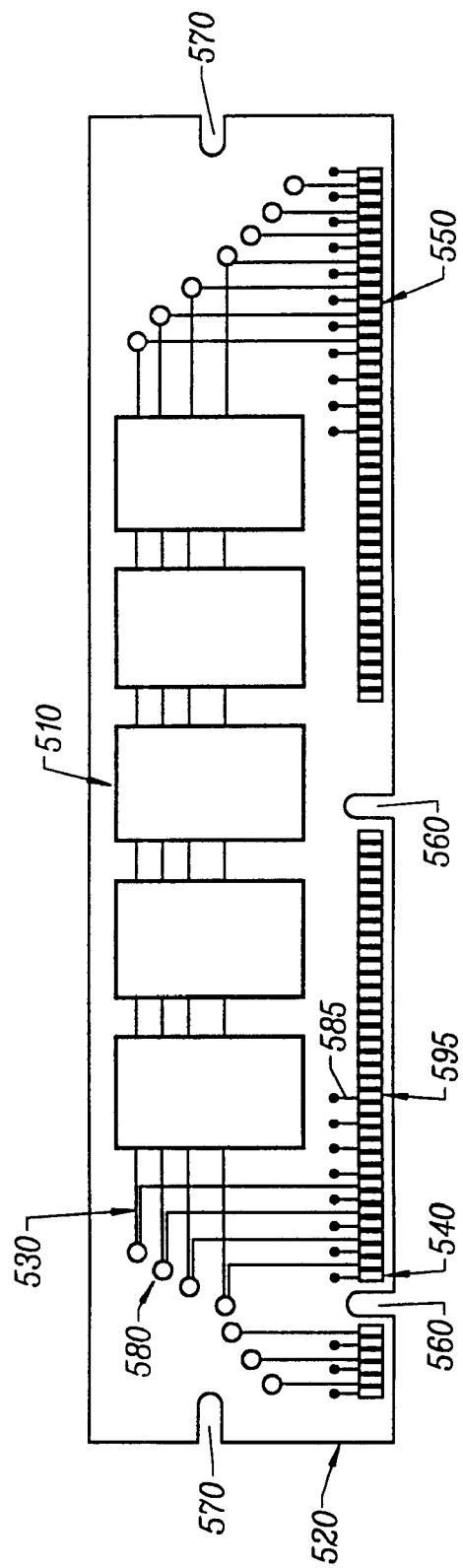
FIG. 5 shows a representative module of an embodiment of the present invention.

A more detailed view of module 420 is shown in FIG. 5 as module 520. Module 520 has devices 510 mounted one side or both sides of the module. The module also includes a set of edge fingers 540, 550 for coupling to the motherboard and bus transmission lines 530 which enter the module on the edge fingers 540 of one side, make a right angle turn at a feedthrough hole 580, traverse along the length of the module connecting to the devices on either side of the module, make another right angle turn and exit on the opposite side edge fingers 550. Edge fingers have a certain distance between their center lines (referred to as pitch) the connection points on the devices have a certain pitch. The pitch puts an upper limit on the width of a line connecting to the fingers 540, 550 or the devices. For example, if the distance between edge fingers (measured from center line to center line) is about 30 mils (thousands of an inch), then the lines 530 which connect to the edge fingers must be less than about 22 mils in width, allowing for an 8 mil separation between lines. Also depicted are edge fingers 595 connecting to a reference plane within the module by means of lines 585. This preserves the relationship of grounds between signals as the signals pass through the connector joining the module to the motherboard.

Notches 560 on the side having the edge fingers are used as a key to assure the proper orientation and electrical and parametric compatibility of the module when coupled to the motherboard. Notches 570 may be used by a clamping or retaining device to hold the device module in place on the motherboard.

Figure 6:
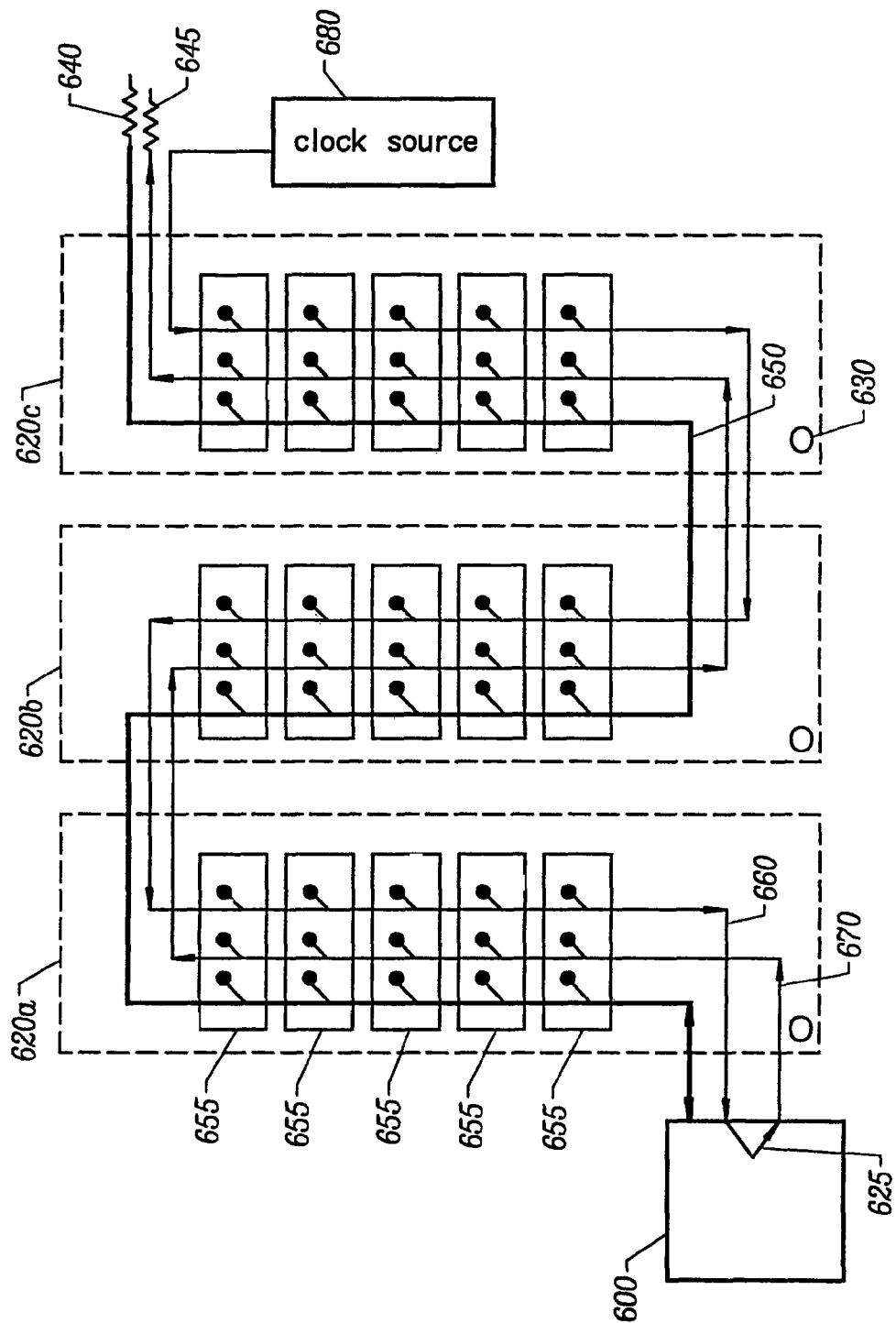
FIG. 6 gives a pictorial view of the routing of the transmission lines for an embodiment of the present invention.

FIG. 6 gives a pictorial view of the routing of a data transmission line and a clock transmission line for an embodiment of the present invention. Data line or lines 650 are routed on the motherboard from master or controller 600 to device module 620*a*. The lines then traverse the length of the module substantially parallel to the long side of the module and exit at the opposite end from the entry onto the module. Along the length of the line on the module each device 655, situated on either side of the module, is connected to the line. The line is routed on the motherboard again until it enters the next module 620*b* at one end, again traversing the length of the module substantially parallel to the long side of the module and exiting at the opposite end. At the exit from module 620*c* the line then runs on the motherboard to a termination device 640. Clock line 660 starts at a clock source 680 and enters module 620*c*. It traverses the module 620*c* connecting to each device and exits from 620*c* onto the motherboard. The clock line 660 continues similarly until it reaches controller 600. Near or within controller 600 the clock line 660 is looped back to join to clock line 670 which travels back through the modules in a similar fashion to the routing for the data line. Upon exiting the module 620*c* the clock line runs on the motherboard to a termination device 645. It is important for the proper operation of the devices that the clock lines 660 and 670 be routed in a fashion similar to the data line 650 and that no relative changes in direction of propagation occur between the two lines. This means that if a signal is propagating on the data line 650 of module 620*a* away from the dot (the orientation dot shown in the lower left of each module) then the signal on the clock line 670 propagates in the same direction and the signal on clock line 660 propagates in the opposite direction. This relationship is preserved between the data line and the clock lines on the motherboard and on the other modules.

Figure 8:
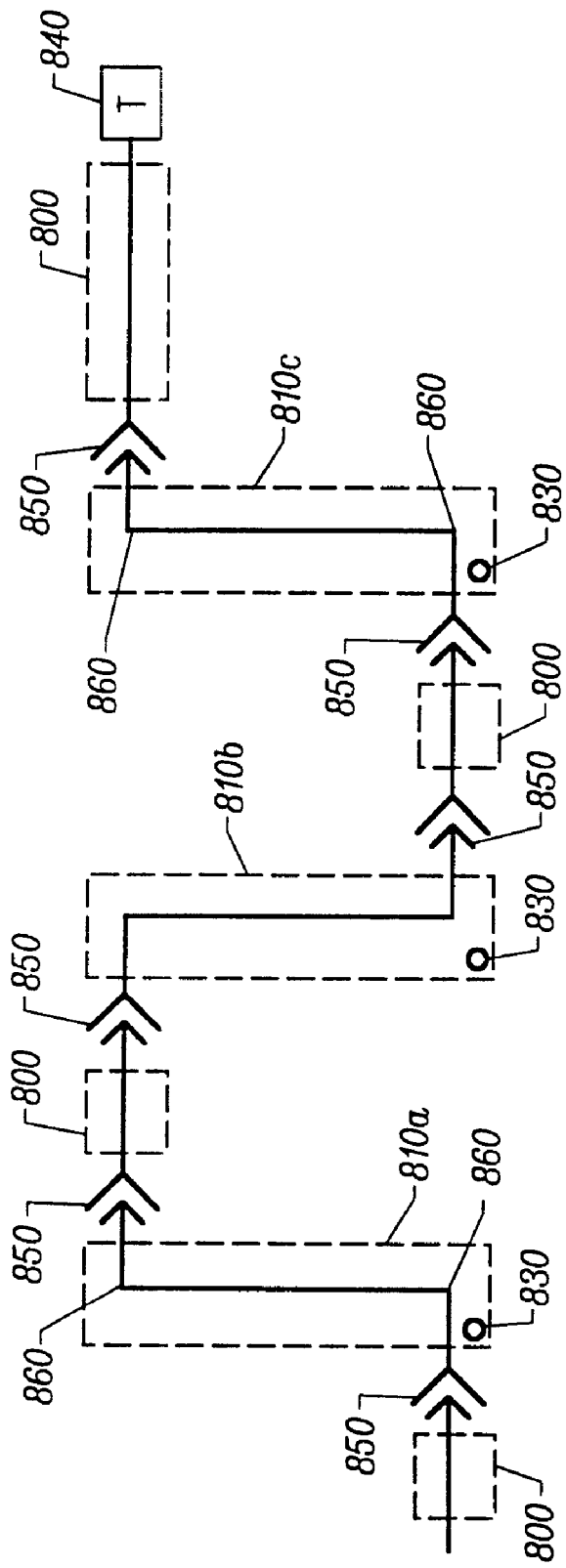
FIG. 8 gives a simplified view of the routing of a data transmission line for an embodiment of the present invention.

FIG. 8 shows a more simple version of the routing of a data line in an embodiment of the present invention. Sections 800 are bus segments of the data line on the motherboard. Sections 810*a-c* are bus segments of the data line on the module with the module orientation key 830 also shown for the module. Couplings between the motherboard bus segments 800 and the module bus segments 850 are also shown. These couplings can be either permanent connections such as connections by means of pins on the module soldered into through-holes on the mother board, or removable connections such as in the case of a connector. The terminator for the bus segment 840 is shown at the end of the line. Also depicted are right angle turns 860 at both ends of the bus segment on the module. These right angle turns are necessary to assure substantially equal lengths for each data line routed according to FIG. 8, when lines connect to the module from a common edge, and is discussed below. Note also that there is symmetry to the routing of the lines on the module. In particular, the right angle turns are on both sides of the device locations. This allows signals to enter and leave the module from either end relative to the orientation key. In either case, the signals still arrive at the same time at the device locations if they started at the same time at the non-terminated end.

In FIG. 8 it is allowed that bus segments 810*a-c* can be segments on the motherboard if there are no modules. These segments 810*a-c* are distinguished from segments 800 by whether there are devices present on the segment. Sections 800 have no devices connected between the ends of the segment whereas sections 810*a-c* have devices connected between the ends.

Figure 9:
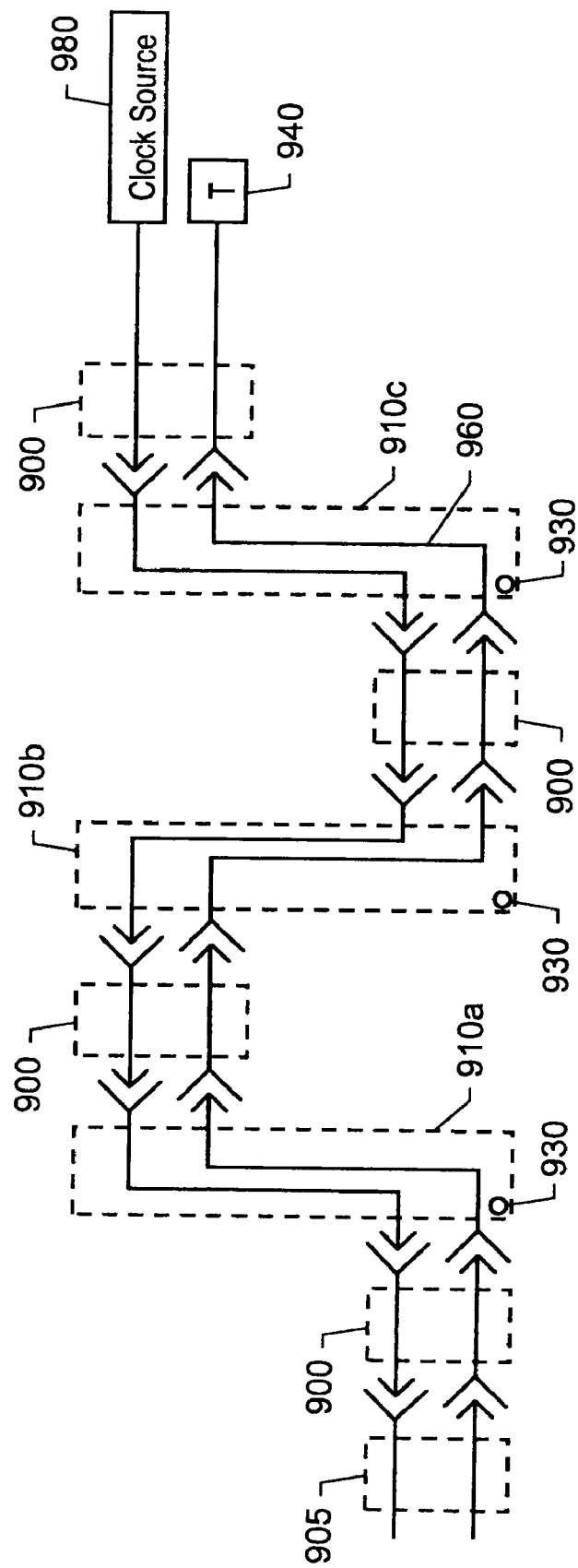
FIG. 9 shows a simplified view of the routing of a clock transmission line for an embodiment of the present invention.

The routing of the clock segments is shown in FIG. 9. Again segments 900 are routed on the motherboard and segments 900*a-c* are those routed on the module. In the case of the clock line, the clock originates from clock source 980 typically located on the motherboard is routed through the modules to the loop 905, typically on the motherboard, back through the modules 900*a-c* and terminates at the termination device 940, also typically on the motherboard. Also shown are the right angle turns 960 that the clock lines must make on the modules 910*a-c*. Keys 930 are shown to indicate that all modules are coupled to the motherboard with the same orientation. Again, the so-called module segments 910*a-c* need not be physically separate from the motherboard, but instead may be segments on the motherboard having devices connected between the ends of the segments. However, no devices are connected between the ends of segments 900.

Figure 10:
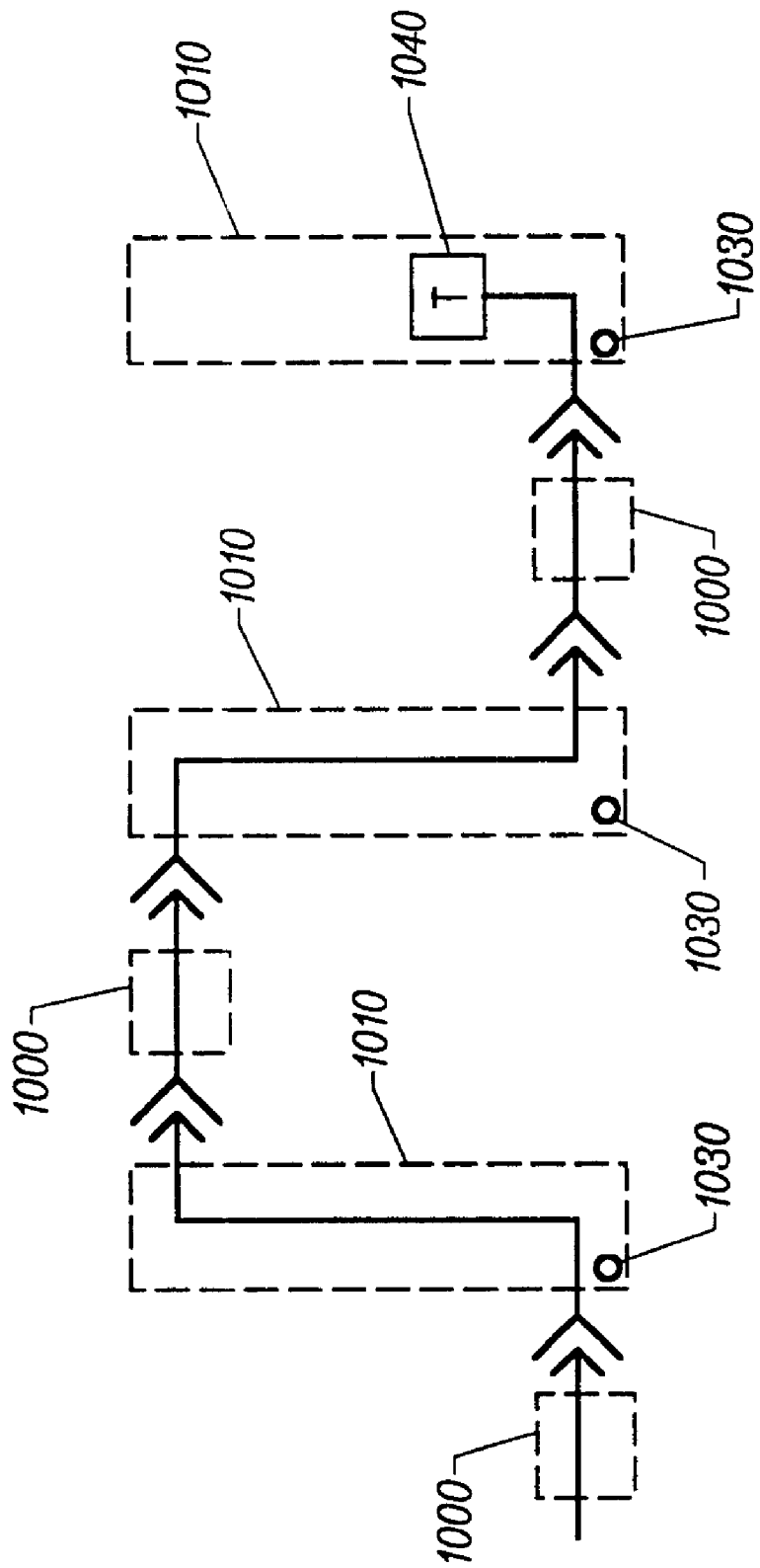
FIG. 10 shows a simplified view of an alternative routing of a data transmission line for an embodiment of the present invention.

FIG. 10 shows an alternate embodiment of the routing of the data line. In the case of FIG. 10 the routing of the line terminates at a termination device 1040 on the module 1010 rather than the motherboard. Again the keys 1030 are shown to give the orientation. Thus, the module having the termination device is the last module in the chain of segments. The clock segment of FIG. 9 could also have the termination device on the last module in a manner similar to the segment of FIG. 10.

Figure 11:
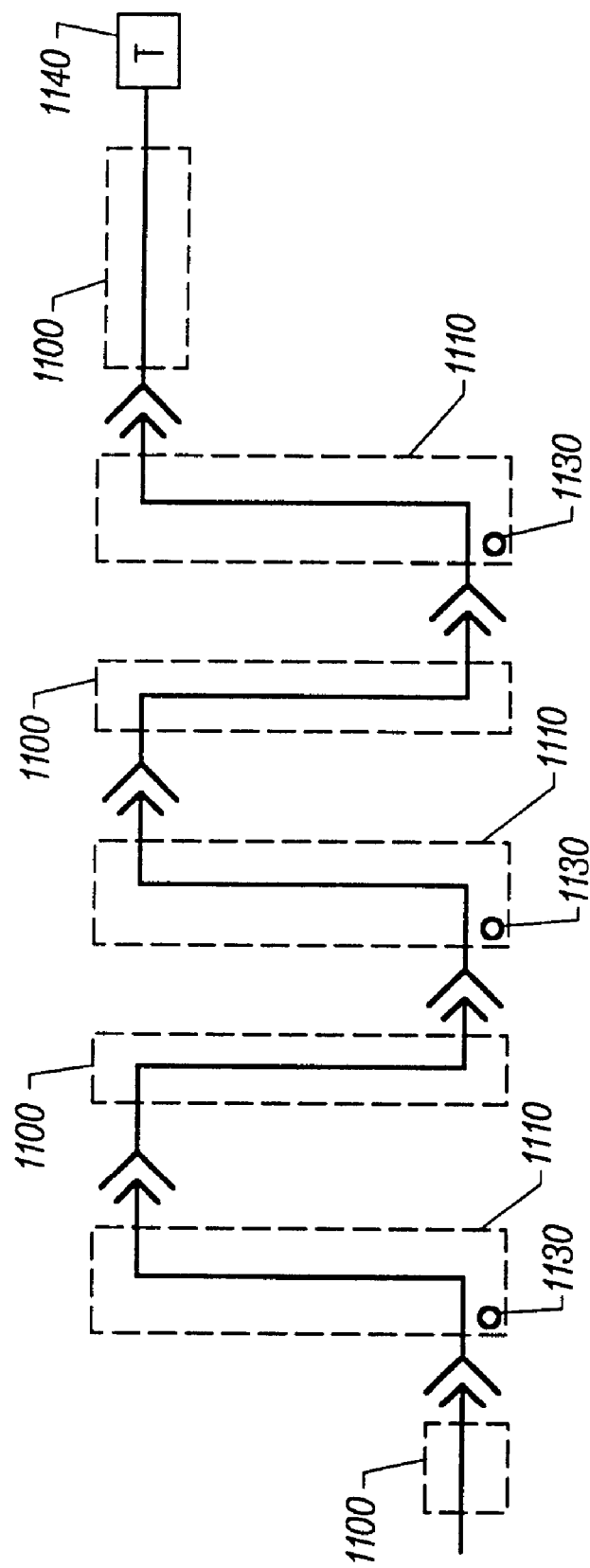
FIG. 11 shows another alternative routing for a data transmission line of an embodiment of the present invention.

FIG. 11 shows the routing of a data line according to an embodiment of the present invention such that the route always enters the keyed end of the module 1110 requiring two folds 1100 on the motherboard. The difference between this embodiment and the one shown in FIGS. 8 and 9 is that the routes in the latter embodiment are shorter, thus reducing the time it takes a signal to propagate from one end to the other end of the line. In some cases it may be necessary to route the bus segments in the chain as shown in FIG. 11.

Figure 12:
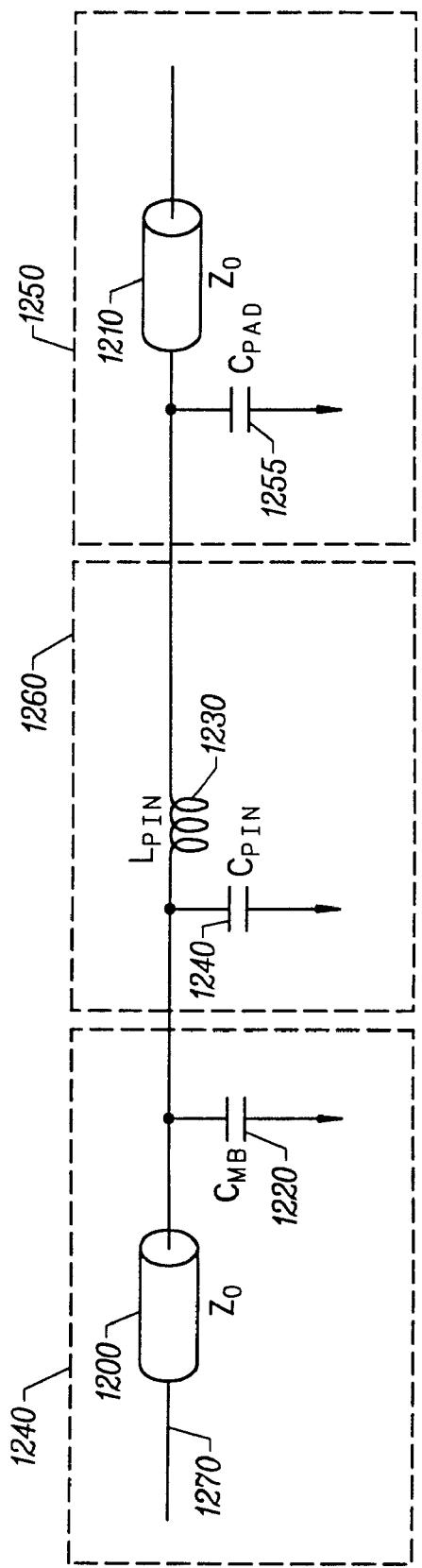
FIG. 12 depicts a circuit model of a data transmission line near the connection point between the motherboard and the module for an embodiment of the present invention.

When connectors are used as the means of coupling between bus segments, certain characteristics of the connector are important with respect to their effect on the transmission lines coupled by the connector. FIG. 12 shows a circuit model of a connector and the transmission lines on either side and near the connection made by the connector. Section 1240 shows an equivalent circuit representation of the transmission line segment on the motherboard near the connector. Section 1250 shows the segment of transmission line on the module near the connector and section 1260 shows a circuit model of the connector itself. In the motherboard section 1240, the unloaded impedance of the line 1200 is Z0, which is preferably in the range of 22 to 32 ohms and more preferably 28 ohms. Motherboard section 1240 also shows the capacitance CMB by capacitor 1220. This capacitance results from a through-hole, surface mount pad or other capacitive structure, placed on the motherboard in the path of the line 1270. The connector section 1260 includes the capacitance CPIN of the connector pin shown as capacitor 1240 and the inductance LPIN of the pin shown as inductor 1230. Finally, section 1250 includes a pad on the module having capacitance CPAD and shown as capacitor 1255. Line 1210 in module section 1250 has the same preferred impedance Z0 as the line 1200 in motherboard module 1240. By controlling the value of CMB and CPAD, the equivalent impedance of the pin is altered to become the preferred impedance Z0. It is preferred for connectors used in connection with an embodiment of the present invention that the pin inductance be in the range of 2 to 3 nanohenrys (Nh). A typical value is approximately 2.3 Nh. The pin capacitance is in the range of 0.5 to 1.0 pico-farads (Pf) and is typically about 0.6 Pf. If the value of CMB and CPAD are made to be about 1 Pf, the total capacitance near the connector is about 2.6 Pf and the total inductance is about 2.3 nH. The result is an effective impedance of about 28-30 ohms for the connector. Thus, a signal propagating from the motherboard section 1240 through the connector section 1260 on onto the module section 1250 encounters no significant change of impedance and no significant reflection is generated. Furthermore, the time to pass through the connector, i.e., from beginning of section 1240 to the end of section 1250 is uniform across all of the signals.

FIG. 13A shows a circuit model for the transmission line segment on a module in an embodiment of the present invention, where the term "module" implies the presence of devices connected to the transmission line segment. In this figure, connection points 1350 represent the coupling between the motherboard and the module, which may be by means of a connector whose characteristics were discussed above. Line sections 1360 are those portions of the transmission line having impedance Z0 and no device connections, and line sections 1320 comprise sections of transmission line 1355 having an unloaded line impedance of Z1 and a device load 1340. FIG. 13B shows an equivalent circuit for the device load indicating that it can be modeled approximately as a capacitor CDL. The value of CDL is approximately in the range of 2-3 Pf, but preferably about 2.5 Pf for a single device connection. To avoid discontinuities between the Z0 section of line 1360 and the portion of line 1320 having the device load, the Z1 impedance of line sections 1355 is increased substantially over the Z0 value so that the equivalent impedance of line section 1320 matches that of the Z0 section 1360. If the nominal impedance of the Z0 section 1360 is about 28 ohms and a device load is to a first order capacitive and approximately 2.5 pF, then Z1 is made approximately 70 ohms. The result is that the additional capacitance reduces the impedance of section 1320 to about 28 ohms according to the well known relationship that the loaded impedance Z1' equals the unloaded impedance Z1 multiplied by the square root of the ratio of the unloaded capacitance C1 to the total capacitance CT.

$$Z1'=Z1\,sqrt(C1/CT) \text{ where } CT=C1+CDL,$$

where CDL is the device load.

Thus, adding capacitance to the line lowers its impedance. A constraint on the above calculation is that the length of section 1320 must be on the order of an inch or less, preferably about 0.25 inches, implying that the device loads must be spaced by about 0.25 inches apart. If the device loads are spaced more widely, say by greater than 1 inch, then a line with an impedance of Z0 must be placed between the device loads so that distance over which the device loading has an effect is reduced to less than an inch. The reason for the distance limitation is based the transition time of the signal and how far that signal can travel during its transition time. Preferably, the signal to be propagated over the line has a rise time of about 200 pico-seconds (pS). During that time the signal will travel about an inch for a line on the surface of the module, assuming that signals on the surface of the module have a flight time of 150 to 200 pS/inch (to be discussed below). If there are no device loads on the module because no devices are present (in the case of a continuity module) then line sections 1320 are not present. Only line sections 1360 having an impedance of Z0 are present and run the length of the module.

Figure 14A:
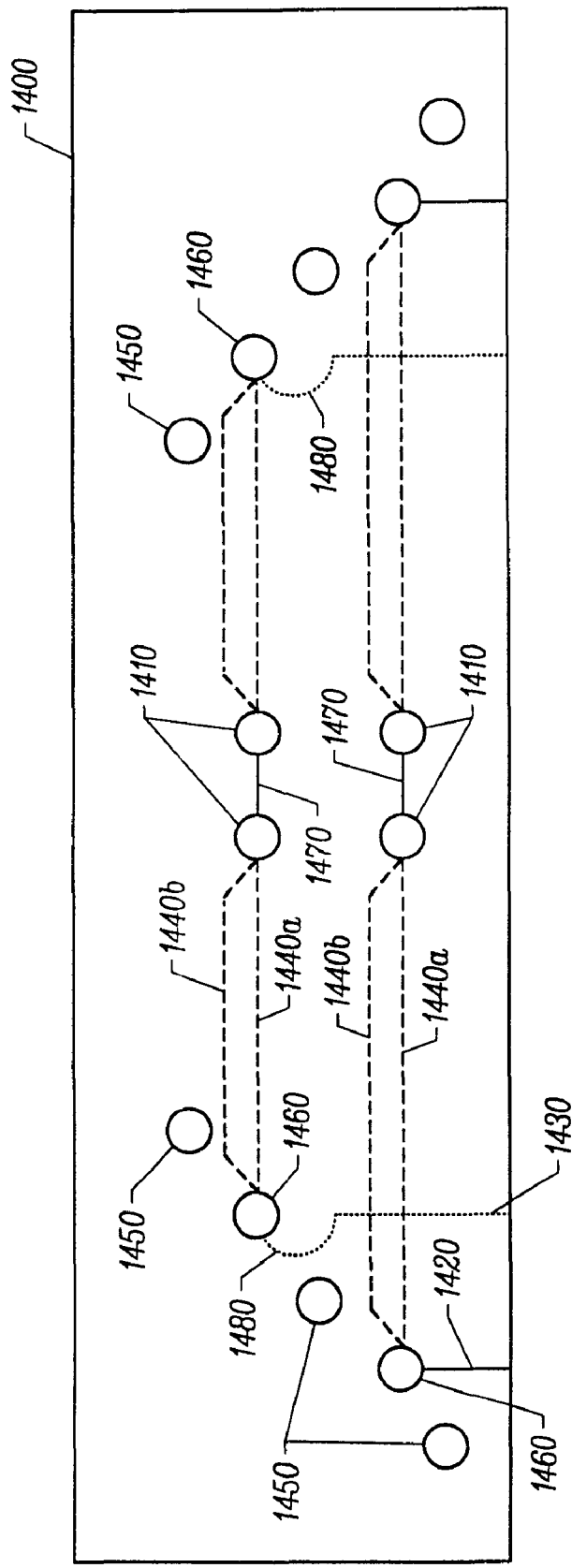
FIG. 14A shows the routing of the transmission lines on the module near the right angle turn of the lines for an embodiment of the present invention.

FIG. 14A shows more detail regarding the routing of the lines on the module 1400 and, in particular, shows the right angle turn taken by a line 1420 routed on the near surface of the module and a line 1430 routed on the far surface of the module. The purpose of the right angle turn is to assure equal and shortest lengths of lines across the module. This helps to assure uniform arrival times of the signals at each of the devices on the module. These lines 1420 and 1430 are received by vias 1460 at which point the lines change direction by 90 degrees to run parallel with the length of the module on a pair of internal sections 1440a,b per line. Dual internal tracks are necessary to match the impedance of the line on the surface 1320 to the impedance of the line internally 1440a,b as will be discussed below. Thus, sections 1420 and 1440a,b comprise section 1360 in FIG. 13A Sections 1440a,b continue their routes down the length of the module until reaching the section where the devices are located on the module. At this point the sections come back to the surface of the module by means of vias 1410 to connect to the device. Sections 1470 of the line comprise section 1320 in FIG. 13A. Sections 1470 continue along the length of the module until a point is reached where there are no more devices to connect to the line. The lines then exit the board in a fashion similar to how the lines entered, again by dual tracks internally for additional routing along the length, then into vias to make the right angle turn and then running on either surface of the module to the connection point of the module with the motherboard. Continuity modules placed anywhere except after the last module having devices on it, should have equal length lines to assure that signals entering the module at the same time leave the module at the same time. Therefore, if turns are used to route the lines of the continuity module, they should be right angle turns to maintain equal lengths for the lines.

Figure 14B:
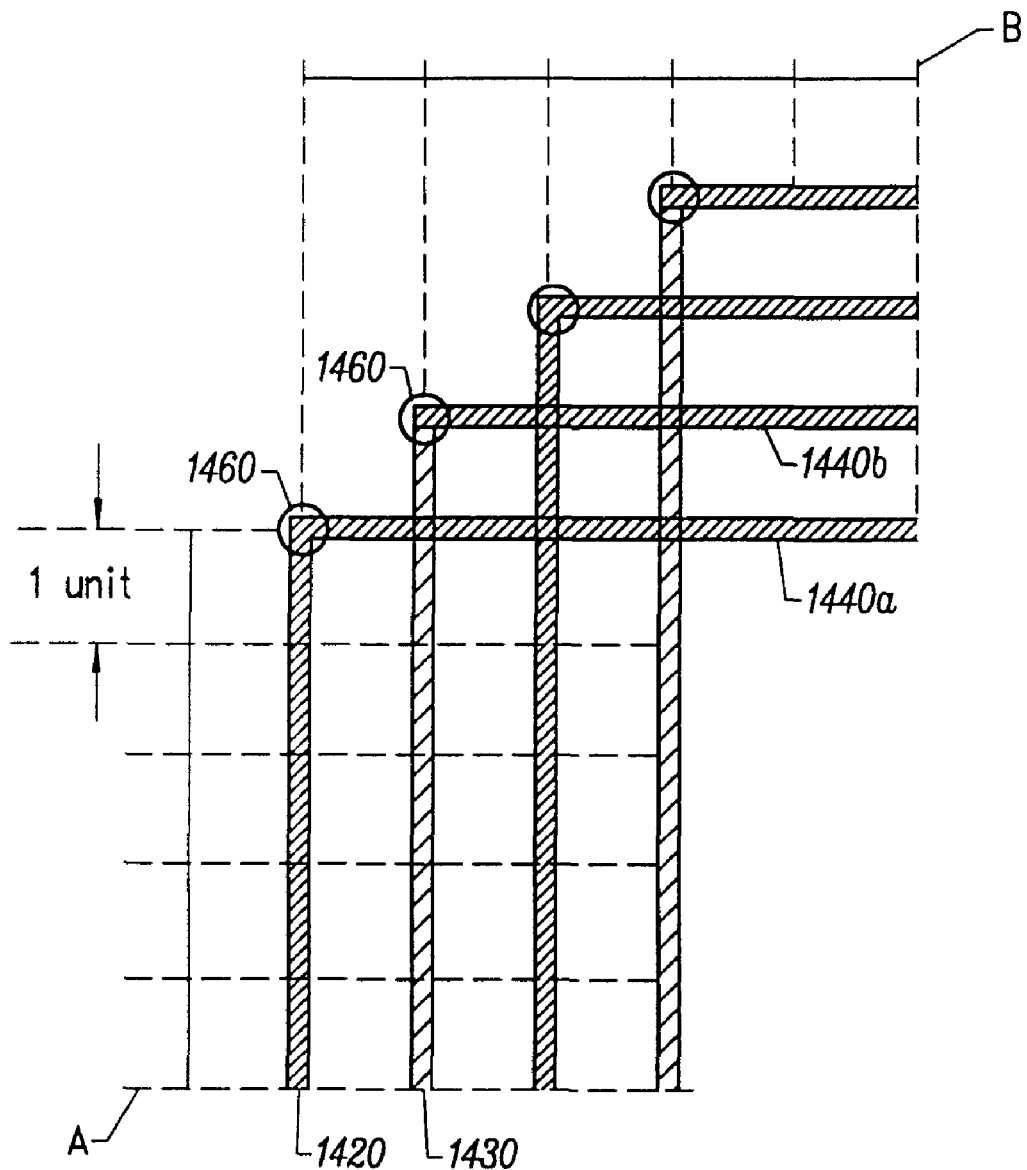
FIG. 14B shows a magnified view of the routing of the transmission lines on the module near the right angle turn for an embodiment of the present invention.

FIG. 14B shows a magnified view of the right angle routing. As can be seen from the figure the length of any line from point A to point B is always equal to 10 units. Line 1420 is routed on one side of the module to a feed through hole 1460 at which point the line 1440a continues on a different layer. Line 1430 is routed on the opposite side of the module from line 1420 to a feed through hole 1460 at which point the line 1440b continues on the same layer as 1440a. This right angle routing thus requires at least three signal layers for routing if lines 1420 and 1430 must be routed on opposite sides of the module, possibly to match the pitch of any connector to which they may connect. Only two layers are required when lines 1420 and 1430 are routed from the same side of the module.

Figure 15A:
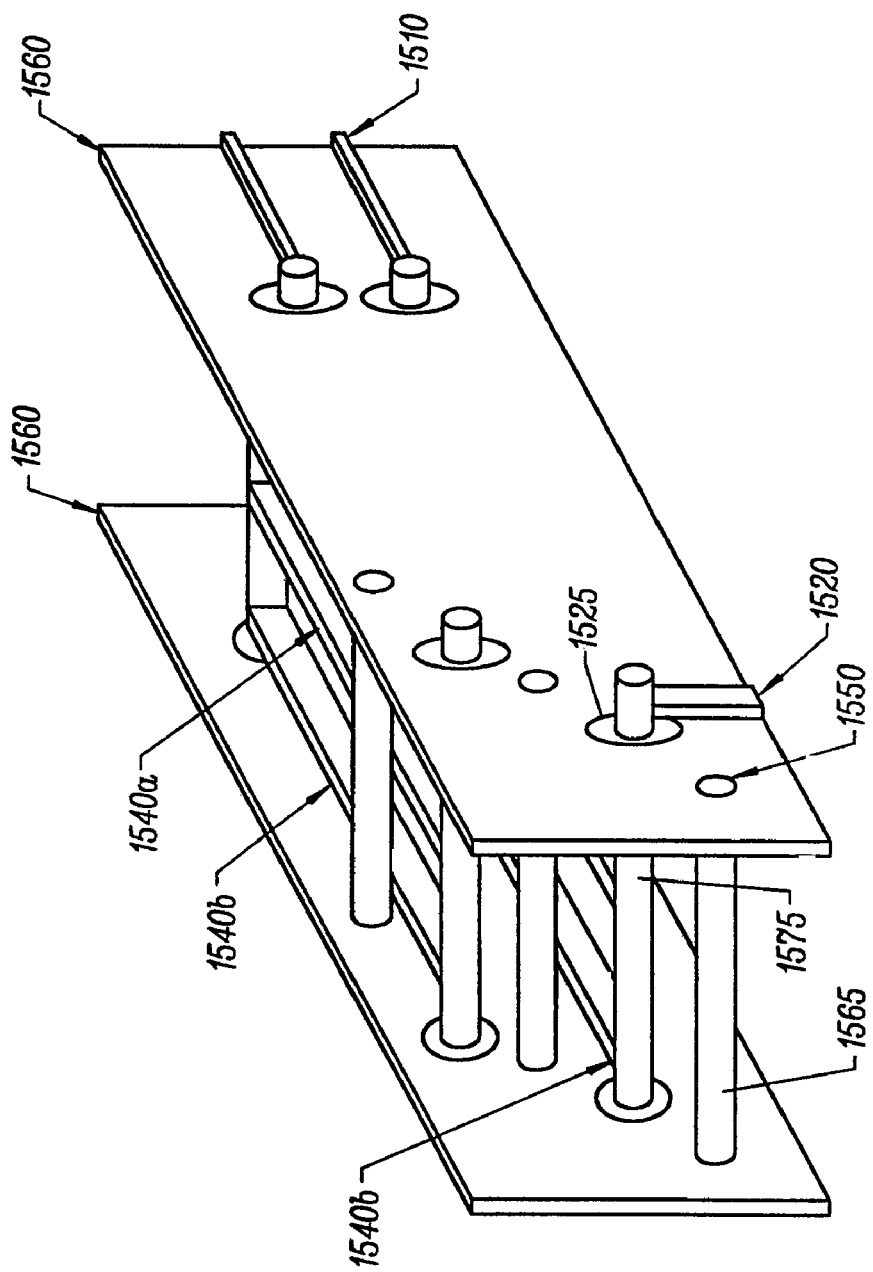
FIG. 15A shows a perspective view from one side of the module of the routing of the transmission lines on the module near the right angle turn of the lines for an embodiment of the present invention.
Figure 15B:
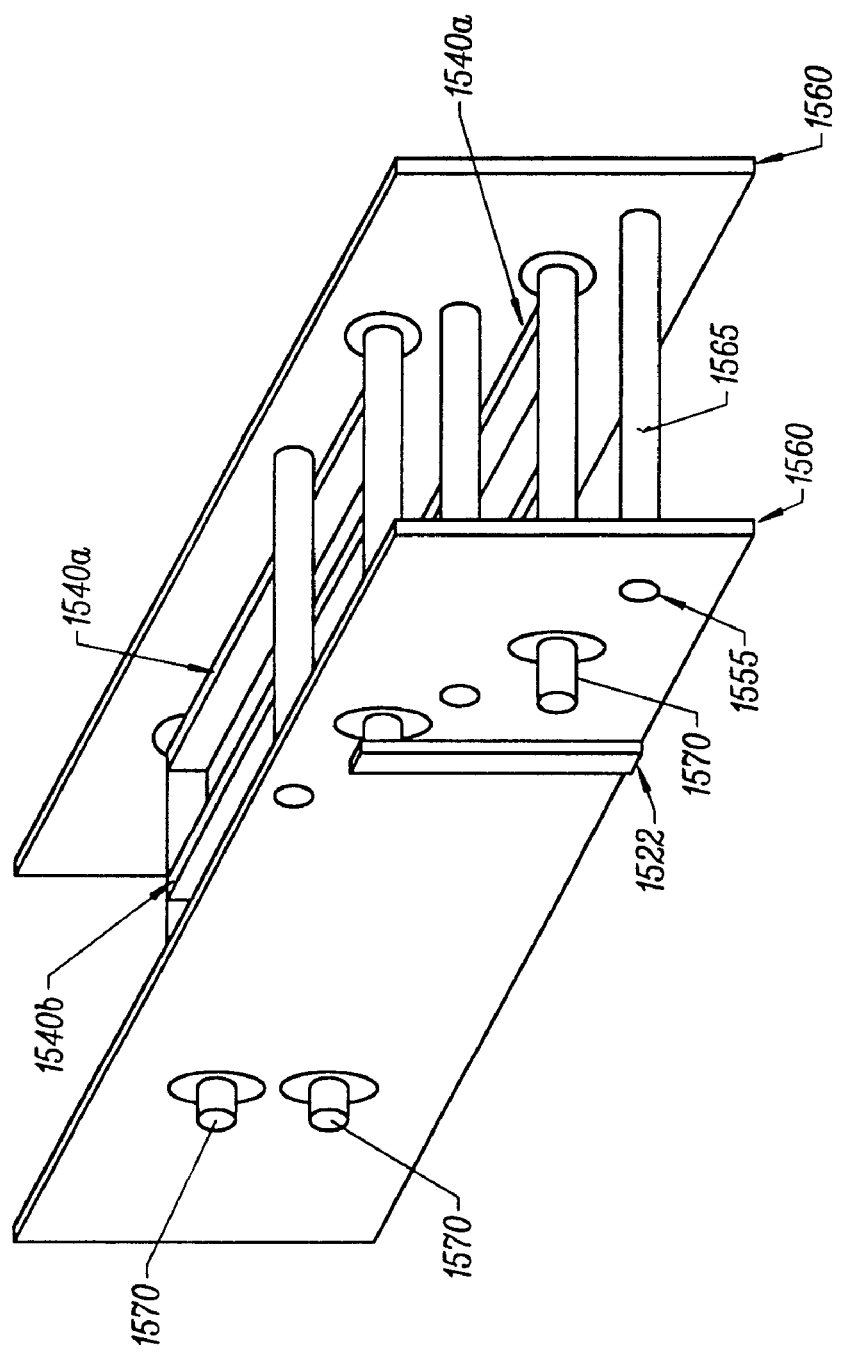
FIG. 15B shows a perspective view from the opposite side shown in FIG. 15A of the module of the routing of the transmission lines on the module near the right angle turn of the lines for an embodiment of the present invention.

FIGS. 15A and 15B give a perspective view of the sections of line and the internal construction of the module. In FIG. 15A sections 1520 correspond to sections 1420 in FIG. 14 and sections 1540a,b correspond to sections 1440a,b in FIG. 14. Sections 1510 in FIG. 15 correspond to sections 1470 in FIG.

14A and are the sections that run at the site of the devices on the module. FIG. 15A also shows the two reference planes 1560 internal to the module to maintain a symmetric structure. These planes are typically at ground potential and provide a return path for the currents traveling on the lines. Vias 1550 connect the two reference planes 1560 together at various points near the via 1525 and internal section 1575 which connects the lines 1520 to the dual internal sections 1540a,b.

FIG. 15B shows the two reference planes 1560, a section 1522 entering on the opposite side of the module from section 1520 in FIG. 15A. Internal sections 1540a,b are shown as in FIG. 15A between the two reference planes 1560. Section 1570 of the line in FIG. 15B results from the plating through of via 1525 in FIG. 15A. The plating is done so that the dual internal tracks 1540a,b can be connected to section 1520 in FIG. 15A. Filled via 1555 is the result of plating through via 1550 in FIG. 15A which serves to connect the two reference planes together. Since section 1520 in FIG. 15A only connects on one side of the module but couples to a pair of internal sections 1540a,b, it is necessary to provide for a return path for the image currents induced by the currents on the internal sections. The section 1565 in FIG. 15A connecting the two reference planes together provides the return path for the image currents. The section 1565 connecting the two reference planes also has the purpose of reducing cross-talk between the signal lines. This effect results from the placement of the section 1565 near the section 1575 coupling the two internal sections to each other and to the signal section 1520, causing the section 1565 to act as a partial shield between the signal lines.

FIGS. 16A-16E show cross-section views of the internal construction of the module for various embodiments of the present invention. As in FIGS. 15A and 15B, dual internal sections 1640a and 1640b, shown in View A, are shown between the two reference planes 1660. Section 1620 is a line section running on the surface of the module away from the sites of the devices and corresponds to section 1520 in FIG. 15A. Section 1675, in Views A and B, is the section that connects the dual internal sections 1640a and 1640b together. Section 1625 is the section of the line that runs on the surface of the module near the location of the IC devices, leaving the space between the two reference planes open for additional lines or reference planes. The additional planes or lines 1670a,b, are shown in View D of FIG. 16. In View D the additional planes may be a plane which provides power to the devices (a power plane) and a reference voltage (Vref) plane for use by all of the devices. The additional planes are placed close to the reference plane to improve the quality of coupling to the reference planes. This helps reduce noise on the additional planes. In another embodiment, shown in View C, section 1627, runs internally rather than on the surface near the location of the IC devices. View E of FIG. 16 shows an alternative embodiment for routing lines internally. Rather than route the lines as in View A where the two lines 1640a and 1640b are connected to the same signal 1620 by feedthrough 1675 and run in parallel between the same reference planes 1660, View E shows a case where the two lines 1640a and 1640b are run in parallel but have their own reference planes. In particular, line 1642a has 1661 and 1662 as its reference planes, and 1642b has 1664 and 1665 as its reference planes. In View E, segments of line having IC devices connected between the ends have one of the lines, either 1640a or 1640b, eliminated. In segments of line having no IC devices connected between the ends, the lines run in parallel connected to the same signal.

Figure 17:
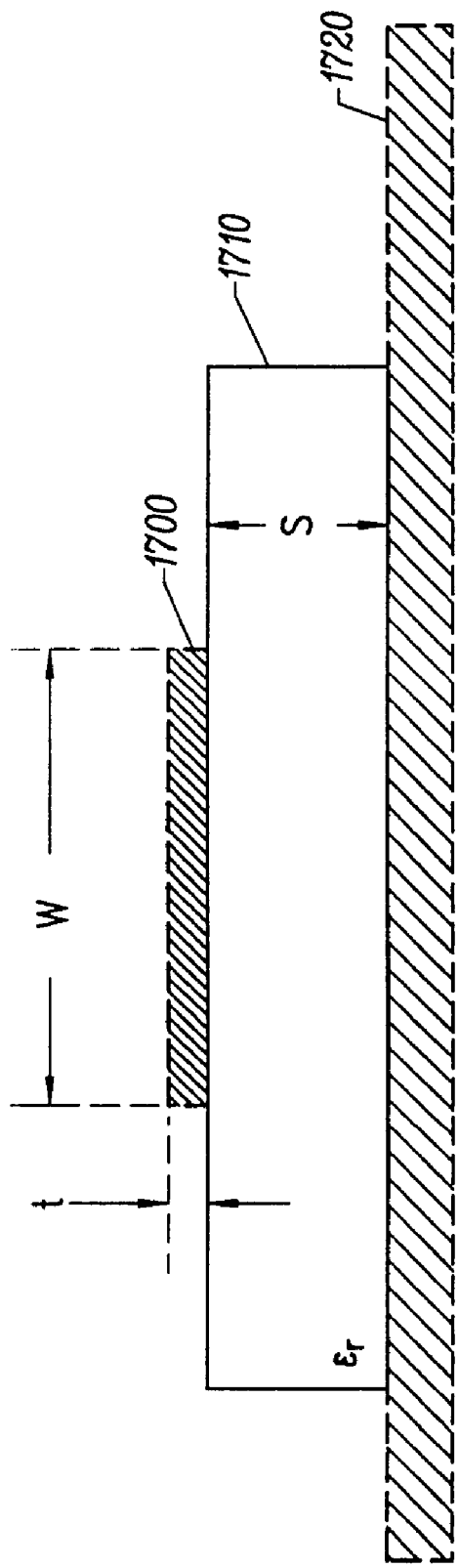
FIG. 17 shows a microstrip with the important parameters for computing the impedance and velocity of the signals on the transmission line of a module for an embodiment of the present invention.
Figure 18:
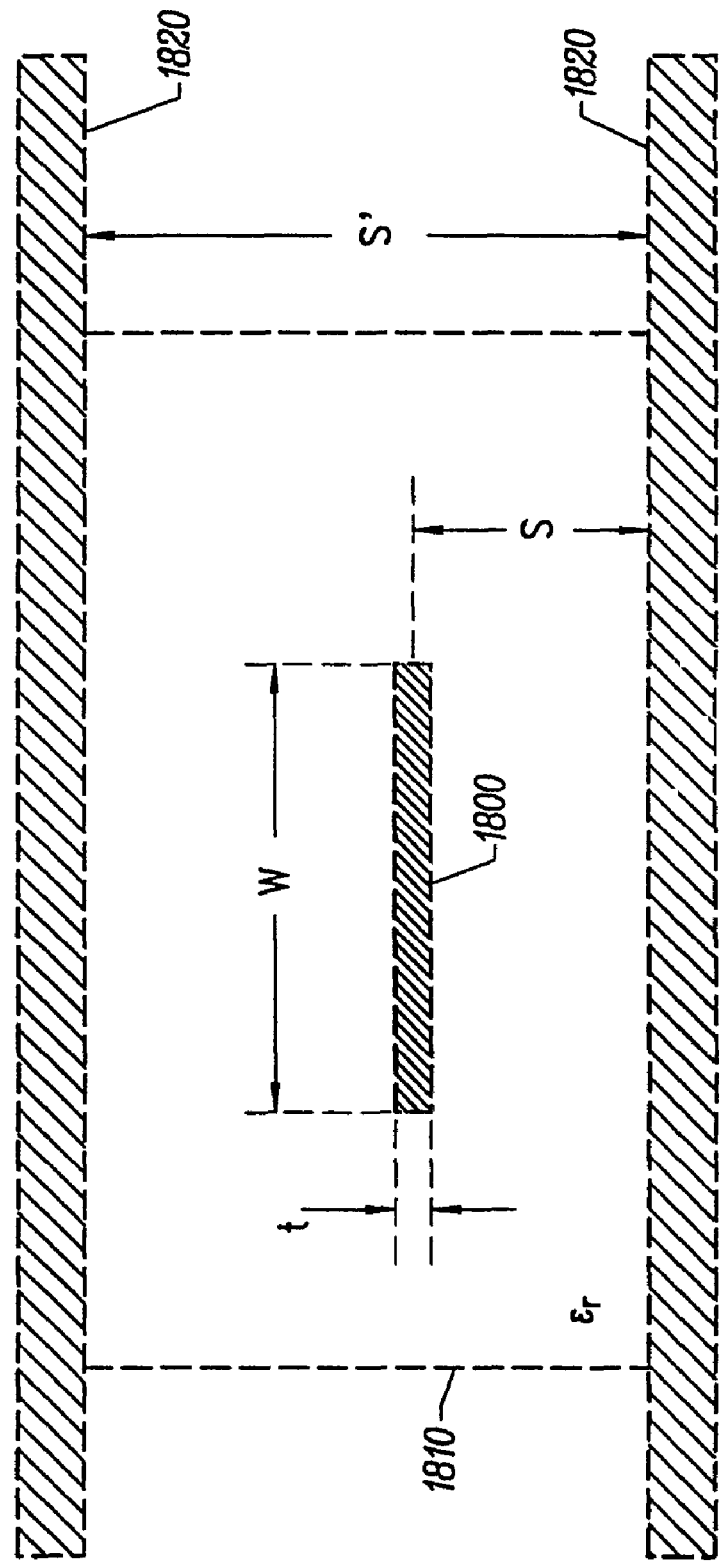
FIG. 18 shows a stripline with the important parameters for computing the impedance and velocity of the signals on the transmission line for an embodiment of the present invention.

Because sections of the line run on the surface of the module and some sections run internally between the two reference planes, the sections of line have different characteristics such as impedance and time of travel (flight time). Sections of line, such as either 1640a or 1640b individually, have a different impedance than section 1620 or 1625 running on the surface of the module. These two types of lines are shown in FIGS. 17 and 18. It is important to match the impedance of the two types of lines and to compensate for any difference in flight time to achieve uniform arrival times of signals at the devices.

FIG. 17 shows, in cross-section, the important parameters for the section of line running on the surface of the module away from the presence of devices, i.e., section 1620 in FIG. 16A. In FIG. 17, the line 1700 has width, W, thickness, t, and runs over a dielectric material 1710 having thickness, S, and permittivity, $\in_r$. Ground plane 1720 is located opposite the line 1700 on the other side of the dielectric. In this construction, commonly referred to as a microstrip, the impedance of the line is determined to a first order by the ratio W/S and the permittivity $\in_r$ of the dielectric. (See Matick, Transmission Lines For Digital and Communication Networks, IEEE Press, 1995, p. 326.). It is preferred to have the width of the line, W, in the range of 20-24 mils, preferably 22 mils to match the pitch of any connector coupled to the line. To construct a line having an impedance of approximately 25-30 ohms and preferably 28 ohms with a material having a permittivity of 4.5, the separation of the line S from the ground plane is in the range of 4.4 to 5.3 mils, preferable 5 mils, giving a W/S ratio of about 4.5. A smaller width line W or a greater separation distance S results in an impedance that is greater than the preferred range of 25 to 30 ohms. Thus, segments of line traveling on the surface of the module and without devices connected between the ends have an impedance in the range of 25 to 30 ohms.

To construct a line of the type shown in FIG. 17, but having an impedance of approximately 70 ohms with the same dielectric material for lines on the surface of the module and to which the devices connect, the W/S ratio is altered to become approximately equal 1.0. Thus, by altering the width of the trace from approximately 22 mils to 5 mils, and holding the distance S constant, a line running on the surface of the module near the IC devices, section 1625 in FIG. 16B, is constructed having an impedance of about 70 ohms. As discussed above, when this line is taken in combination with the device load, the impedance of the section is reduced to about 28 ohms, thus matching the impedance of an line section which is does not have any devices connected to it.

Figure 19:
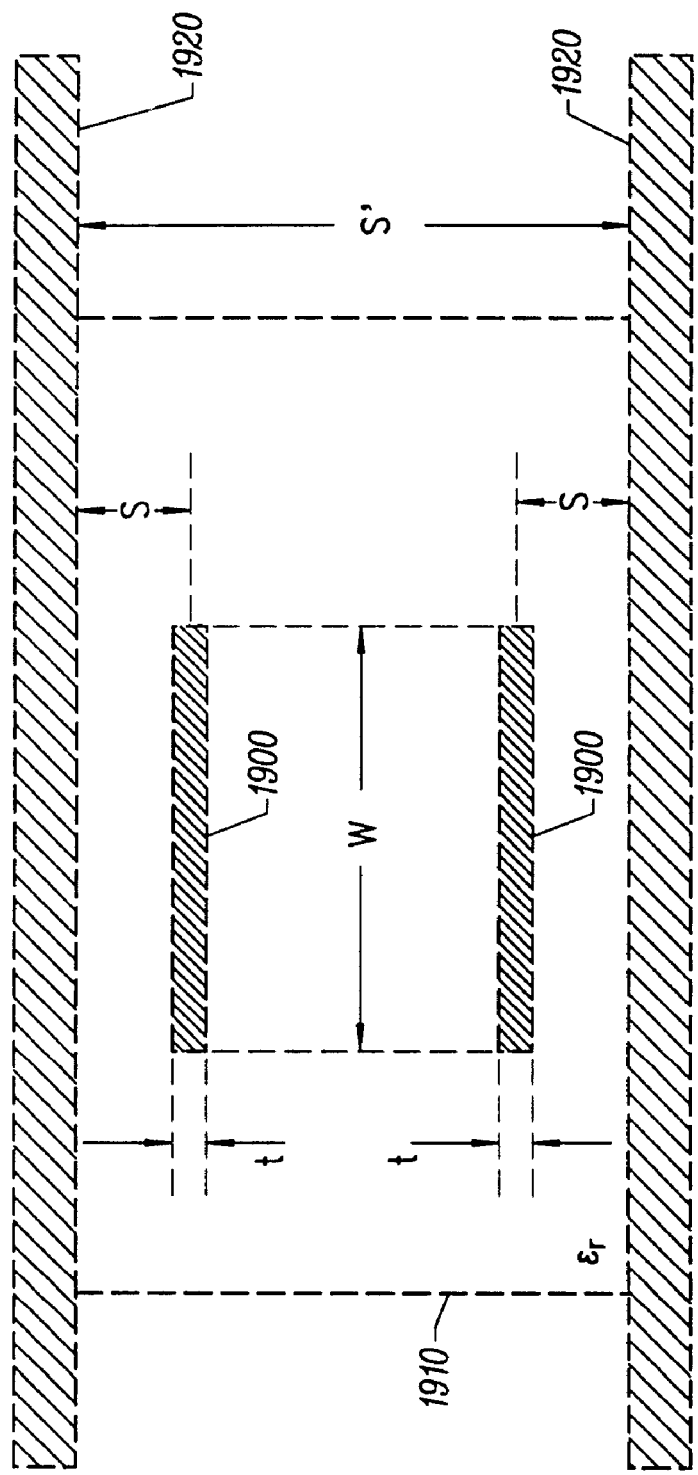
FIG. 19 shows a stripline with two internal transmission lines and the important parameters for computing the impedance and velocity of the signals on the transmission line for an embodiment of the present invention.

FIG. 18 shows, in cross-section, the important parameters for a section of line having no devices connected to it and running internally between the two reference planes of the module, i.e., section 1640a or 1640b in FIG. 16A. In FIG. 18, the width of the line 1800 is W and its thickness is t. The separation distance between the two reference planes 1820 is S' and the dielectric filling the separation distance has a permittivity of $\in_r$. In this construction, the impedance of the line is determined to a first order by the W/S' ratio, the t/S' ratio and the permittivity $\in_r$. (See Matick, Transmission Lines For Digital and Communication Networks, IEEE Press, 1995, p. 327.) The W/S' ratio will typically be less than 1 for lines having practical values of trace widths, W, of about 22 mils or less, determined by connector pitch and a practical separation distance S' between planes of approximately 35 mils determined by module thickness required for insertion of the module into a socket. Under these circumstances, the impedance of a line shown in FIG. 18, commonly referred to as a stripline, will be approximately 50 ohms when W is approximately 14 mils, S' is approximately 35 mils and t is approximately 1.4 mils (for 1 ounce copper plating). This impedance does not match the preferred impedance of the other lines to which the internal lines connect assuming the use of the same dielectric material. Therefore, two lines, connected to the same signal, are run in parallel internally as is shown in FIGS. 16 and 19. The use of two lines reduces the impedance from 50 ohms to about 28 ohms (rather than 25 ohms) due to inductive coupling that is present between the lines. Thus, the use of the dual parallel lines creates a internal section of line that matches the impedance of the other lines to which the internal section connects.

To construct a line of the type in FIG. 18 having an impedance of approximately 70 ohms for sections having devices connected, such as section 1627 in View C of FIG. 16, the W/S' ratio is altered to about 0.15 by decreasing the width of the trace from about 14 mils to 5.5 mils. The thickness of the trace, t, and the other parameters are held constant. To construct a line of the type in FIG. 18 having an impedance of approximately 50 ohms, such as for section 1642a or 1642b in View E of FIG. 16, the separation distance S' is about 15 mils, the line width W is about 3 mils, and the line thickness is 1.4 mils. This creates a W/S' ratio of about 0.2 and a t/S' ratio of about 0.1. The impedance then is about 56 ohms for $\in'_r$ equal to 4.5. Thus, two lines 1642a and 1642b are run in parallel and connected to the same signal to give an impedance of 28 ohms for segments of the line without IC devices. Near the IC devices one of the lines 1642a or 1642b is eliminated resulting in a segment of line having an impedance of 56 ohms for segments of the line with IC devices. With device loads taken into account, the impedance is reduced to 28 ohms.

There is still a problem associated with the use of the two types of lines as shown in FIGS. 17 and 18, even if the lines are constructed so that the impedance is the same for each type. The problem is that the time for a signal to travel a unit distance (flight time) for a line constructed as in FIG. 17 is faster than the flight time for a line constructed as in FIG. 18. The expression for the flight time TF is $$TF = TCsqrt(\in'_r),$$

where TC is the flight time of a signal in free space (approximately 84.7 picoseconds per inch=3.33 pS/millimeter) and $\in'_r$ is the effective relative permittivity of the medium in which the signal propagates. For lines constructed according to FIG. 18 or 19, the flight time is about 180 pS/in (picoseconds per inch), because the effective relative permittivity is about 4.5. The flight time of a line constructed according to FIG. 17 is more difficult to determine because the effective relative permittivity has a contribution from both the dielectric 1710 and air surrounding the top and sides of the conductor 1700. The effective relative permittivity is less than that of the dielectric and in the range of 3.0 to 3.15. Thus, according to the equation, flight time for such a line is in the range of about 145 pS/in to 150 pS/in. Compared to the line in FIG. 18, the line in FIG. 17 is about 17% to 20% faster.

To assure that signals traveling on the lines of the module arrive at the IC device at the same time requires some form of compensation which takes into account the different flight times of the different types of lines. In one embodiment of the present invention, the physical line is first made to have the same length by routing the lines with a right angle turn as shown on FIG. 14A,B. Right angle turning or "folding" of the line assures that the length of section 1420 added to the length of section 1440a is the same for all of the folded lines. This helps to cut down on the differences between arrival times at the IC device locations 1410 in FIG. 14A,B. Next, the slowest path to a device is identified. In the embodiment shown in FIG. 14A,B, the slowest path is the path comprising sections 1420 and 1440a. This path is slowest because the signals on this path travel the longest distance over a section of the line with the slowest flight time. Finally, delay matching segments, 1480 in FIG. 14 (and 530 in FIG. 5) are added to the faster paths so that the signals on them arrive at the IC device site 1410 at the same time as the slowest path. Thus, folding the group of lines, assures that the lines have equal lengths except for the delay compensating sections which are then added to compensate for the unequal flight times between the two types of lines. After compensation, signals entering the module take the same time to travel to the site of the IC devices 1410 regardless of the particular routing path of the line.

Continuity modules used to couple the bus to modules having devices on them, should have delay matching segments added if the routes on the continuity module use right angle turns with portions of the turn having different flight times. The delay matching segments assure that signals entering the continuity module at the same time, leave the continuity module at the same time. A continuity module connected to the termination device need not have any delay matching segments added as uniform arrival times of signals at the termination device is not necessary.

Figure 7:
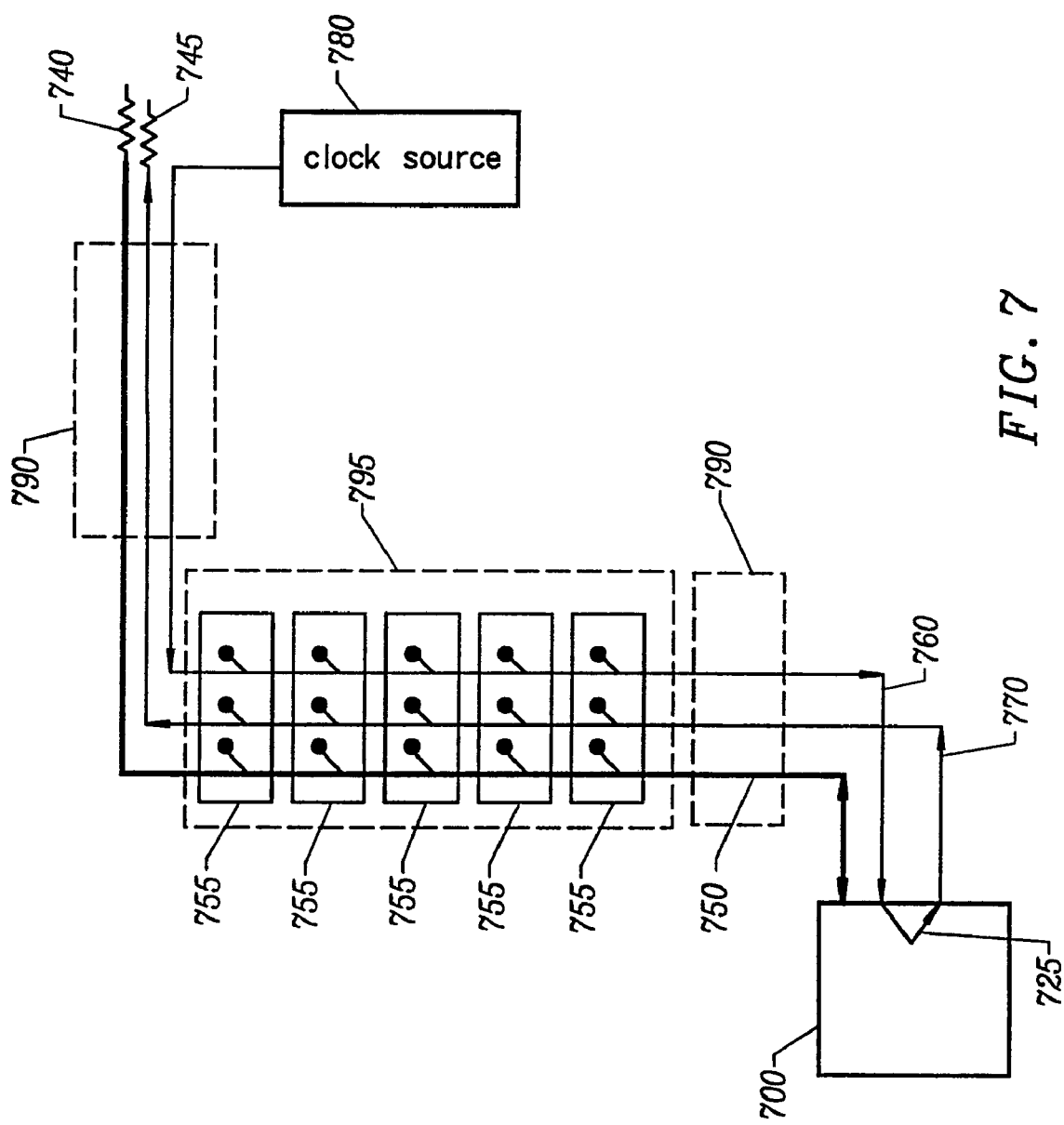
FIG. 7 gives a pictorial view of the routing of the transmission lines on the motherboard for an embodiment of the present invention.

Although the invention has been described in considerable detail with reference to certain embodiments thereof, other embodiments are possible. For example, FIG. 7 shows another embodiment of the present invention in which the devices are mounted on the motherboard directly. The bus has sections 790 in which no devices are present and a section 795 with devices connected. The data lines are routed from the controller or master 700 to the individual devices 755 and then to the terminator device 740. Near the devices, the width of the data lines is altered to maintain an impedance that matches the nominal impedance of the sections 790 where there are no devices 755. Where data lines must turn in their route from the controller to the devices or from the devices to the terminating device, the turns are right angle turns to maintain the same length of each line. In addition, delay matching segments are added where there are sections of the route that have different flight times. Thus the arrival time of signals to the devices in the device segment of the line 795 is still assured.

In FIG. 7, the clock lines are routed from the clock source 780 to the devices 755 to the controller 700. At or near the controller the clock line reverses direction by means of clock loop 725 and continues on line 770 to a terminator device 745. The clock lines have uniform impedance throughout the length of the line, again by altering the width of the clock sections near the devices to match the impedance of sections 790 without devices. Again, right angle turns are employed to maintain the same length of line as the data lines. Delay matching segments are added where there are sections of the route that have different flight times. Another embodiment that is possible is locating the controller 400 depicted in FIG. 4 on a module 420 rather than on the motherboard 410. Therefore, the spirit and scope of the appended claims should not be limited to the description of the preferred versions contained therein.

What is claimed is:

1. A module comprising:
   a substrate;
   a signal line that includes a first segment connected to a second segment via a first turn portion such that the first segment of the signal line and the second segment of the signal line are oriented in different directions, and wherein a data signal traverses the signal line starting at a first edge finger disposed on the substrate, then traverses the first segment of the signal line, then traverses the first turn portion, then traverses the second segment of the signal line, all before terminating at a first termination element;
a clock line that includes a first segment connected to a second segment via a second turn portion such that the first and second segments of the clock line are oriented in different directions the clock line to provide a clock signal that traverses the clock line starting at a second edge finger, then traverses the first segment of the clock line, then traverses the second turn portion, then traverses the second segment of the clock line, all before terminating at a second termination element; and
a plurality of memory devices disposed on the substrate, wherein each memory device of the plurality of memory devices is connected to the second segment of the signal line and second segment of the clock line such that the signal and clock signal traversing along the signal line and clock line, respectively, arrive at the plurality of memory devices in sequence.

2. The module of claim 1, further including a plurality of signal lines routed alongside the signal line such that each signal line of the plurality of signal lines includes, respectively, a first segment, turn portion, and second segment that are routed alongside the respective first segment, first turn portion, and second segment of the signal line.

3. The module of claim 1, wherein the first turn portion is a right angle turn portion, such that the first segment of the signal line is oriented perpendicular to the second segment of the signal line.

4. The module of claim 1, wherein the first turn portion comprises a via that is routed through a feedthrough hole in the substrate of the module.

5. The module of claim 1, wherein the substrate includes a first side and a second side, wherein the first side is positioned opposite to the second side, and wherein a first memory device of the plurality of memory devices is disposed on the first side of the substrate and a second memory device of the plurality of memory devices is disposed on the second side of the substrate.

6. The module of claim 1, wherein the module includes at least three signal layers, and wherein:
the first segment of the signal line is routed on the first side of the substrate, the first turn portion comprises a via that is routed through a first feedthrough hole in the substrate, and the second segment of the signal line is routed in an internal layer of the substrate; and
the first segment of the clock line is routed on the second side of the substrate, the second turn portion of the clock line comprises a via that is routed through a second feedthrough hole in the substrate, and the second segment of the clock line is routed in the internal layer of the substrate.

7. The module of claim 1, wherein the first segment of the signal line is disposed along a width of the substrate and the second segment of the signal line is disposed along a length of the substrate such that the length is oriented perpendicular to the width.

8. The module of claim 1, wherein a length of the signal line between the first edge finger and the first termination element is substantially equal to a length of the clock line between the second edge finger and the second termination element.

9. The module of claim 1, wherein the first segment of the signal line is routed substantially parallel to a first edge of the module and the second segment of the signal line is routed substantially parallel to a second edge of the module, wherein the second edge is longer than the first edge.

10. A module comprising:
a substrate;
first and second edge fingers disposed at a first edge of the substrate;
a signal line that includes a first segment, first turn portion, second segment, second turn portion, and third segment such that a data signal traverses the signal line starting at the first edge finger, then traverses the first segment of the signal line, then traverses the first turn portion, then traverses the second segment of the signal line, then traverses the second turn portion, then traverses the third segment of the signal line;
a clock line to provide a clock signal that traverses the clock line starting at the second edge finger, then traverses a first segment of the clock line, then traverses a third turn portion, then traverses a second segment of the clock line, then traverses a fourth turn portion, and then traverses a third segment of the clock line; and
a plurality of memory devices disposed on the module, wherein each memory device of the plurality of memory devices is connected to the second segment of the signal line and second segment of the clock line such that the data signal and clock signal traversing along the signal line and clock line, respectively, arrive at each memory device of the plurality of memory devices in sequence.

11. The module of claim 10, further including a plurality of signal lines routed alongside the signal line such that each signal line of the plurality of signal lines includes, respectively, a first segment that is routed alongside the first segment of every other signal line of the plurality of signal lines, a second segment that is routed alongside the second segment of every other signal line of the plurality of signal lines, then traverses a third segment that is routed alongside the third segment every other signal line of the plurality of signal lines.

12. The module of claim 10, wherein the first turn portion is a right angle turn portion, such that the first segment of the signal line is oriented perpendicular to the second segment of the signal line.

13. The module of claim 10, wherein each of the first and second turn portions are right angle turn portions, such that the first segment of the signal line is oriented perpendicular to the second segment of the signal line and the second segment is oriented perpendicular to the third segment of the signal line.

14. The module of claim 10, wherein each of the first and second turn portions comprise a respective via that is routed through a respective feed-through hole in the substrate of the module.

15. The module of claim 10, wherein a first memory device of the plurality of memory devices is disposed on a first side of the substrate and a second memory device of the plurality of memory devices is disposed on a second side of the substrate, wherein the first side is oriented opposite the second side.

16. The module of claim 10, wherein the module includes at least three signal layers, and wherein:
the first segment of the signal line is routed on a first side of the substrate, the first turn portion comprises a via that is routed through a first feed-through hole in the substrate, and the second segment of the first signal line is routed in an internal layer of the substrate, and
the first segment of the clock line is routed on the second side of the substrate, the second turn portion of the clock line comprises a via that is routed through a second feed-through hole in the substrate of the module, and the second segment of the clock line is routed on the internal layer of the substrate.

17. The module of claim 10, wherein the first segment and third segment of the signal line are disposed along a width of the substrate and the second segment of the signal line is disposed along a length of the substrate such that the length is oriented perpendicular to the width.

18. The module of claim 10, wherein the first segment of the signal line is routed substantially parallel to a first edge of the module and the second segment of the signal line is routed substantially parallel to a second edge of the module, wherein the second edge is longer than the first edge.

19. A method of operating a module, the method comprising:
- traversing a signal starting at a first edge finger disposed on the substrate, then through a first segment of a signal line, then through a first turn portion, then through a second segment of the signal line before terminating at a first termination element;
- traversing a clock signal alongside the signal starting at a second edge finger, then through a first segment of a clock line that is routed alongside the first segment of the signal line, then through a second turn portion, then through a second segment of the clock line that is routed alongside the second segment of the signal line before terminating at a second termination element; and
- wherein each of the signal and clock signal traversing along the signal line and clock line, respectively, arrive at each memory device, of a plurality of memory devices, in sequence.

20. A method of operating a module, the method comprising:
- traversing a signal starting at a first edge finger disposed on a substrate of the module, then through a first segment of a signal line, then through a first turn portion of the signal line, then through a second segment of the signal line, then through a second turn portion of the signal line, then through a third segment of the signal line; and
- traversing a clock signal alongside the signal line starting at a second edge finger disposed on the substrate of the module, then through a first segment of a clock line that is routed alongside the first segment of the signal line, then through a first turn portion of the clock line, then through a second segment of the clock line that is routed alongside the second segment of the signal line, then through a second turn portion of the clock line, then through a third segment of the clock line that is routed alongside the third segment of the signal line;
- wherein each of the signal and clock signal traversing along the signal line and clock line, respectively, arrive at each memory device, of a plurality of memory devices, in sequence.

21. An apparatus comprising:
- a substrate;
- a controller device disposed on the substrate;
- a signal line that includes a first segment connected to a second segment via a first turn portion, such that the first segment and the second segment are oriented in different directions, and wherein a data signal traverses the signal line starting at the controller device, then traverses the first segment of the signal line, then traverses the first turn portion, then traverses the second segment of the signal line, all before terminating at a first termination element;
- a clock line that includes a first segment connected to a second segment via a second turn portion such that the first and second segments of the clock line are oriented in different directions, and wherein a clock signal traverses the clock line starting at the controller device, then traverses a first segment of the clock line, then traverses a second turn portion, then traverses a second segment of the clock line, all before terminating at a second termination element; and
- a plurality of memory devices, wherein each memory device of the plurality of memory devices is connected to the second segment of the signal line and second segment of the clock line such that the data signal and clock signal traversing along the signal line and clock line, respectively, arrive at each memory device of the plurality of memory devices in sequence.

22. The apparatus of claim 21, wherein the substrate is a motherboard comprising a socket, and wherein the plurality of memory devices are disposed on a module having a connector interface that is capable of being inserted into the socket.

23. The apparatus of claim 22, wherein the first segment of the signal line, turn portion, and second segment of the signal line are routed on the memory module.

24. The apparatus of claim 21, wherein the first turn portion is a right angle turn portion, such that the first segment of the signal line is oriented perpendicular to the second segment of the signal line.

25. The apparatus of claim 21, further including a plurality of signal lines routed alongside the signal line such that each signal line of the plurality of signal lines includes, respectively, a first segment, a turn portion, and a second segment that are routed alongside the respective first segment of the signal line, first turn portion, and second segment of the signal line.

* * * * *